(12) United States Patent
Duncan et al.

(10) Patent No.: US 12,369,269 B2
(45) Date of Patent: Jul. 22, 2025

(54) MODULE-TO-MODULE MECHANICAL, ELECTRICAL, AND AIRFLOW CONNECTIONS IN MODULAR DATA CENTERS

(71) Applicant: Dell Products L.P., Round Rock, TX (US)

(72) Inventors: Tyler Baxter Duncan, Austin, TX (US); Anthony Middleton, Cedar Park, TX (US); Jeffery Todd Sayles, San Marcos, TX (US)

(73) Assignee: DELL PRODUCTS L.P., Round Rock, TX (US)

( * ) Notice: Subject to any disclaimer, the term of this patent is extended or adjusted under 35 U.S.C. 154(b) by 463 days.

(21) Appl. No.: 17/970,348

(22) Filed: Oct. 20, 2022

(65) Prior Publication Data
US 2024/0138085 A1 Apr. 25, 2024
US 2024/0237252 A9 Jul. 11, 2024

(51) Int. Cl.
*H05K 7/14* (2006.01)
*H05K 7/20* (2006.01)

(52) U.S. Cl.
CPC ......... *H05K 7/1497* (2013.01); *H05K 7/202* (2013.01); *H05K 7/20836* (2013.01)

(58) Field of Classification Search
CPC ... H05K 7/1497; H05K 7/202; H05K 7/20836
USPC .... 361/881, 6, 818, 816, 728, 752, 796, 800
See application file for complete search history.

(56) References Cited

U.S. PATENT DOCUMENTS

| | | | | |
|---|---|---|---|---|
| 5,954,823 | A * | 9/1999 | Cutts | G06F 1/189 713/300 |
| 9,622,373 | B1 * | 4/2017 | Sarti | H02M 3/04 |
| 2012/0155027 | A1 | 6/2012 | Broome | |
| 2015/0177750 | A1 * | 6/2015 | Bailey | G05D 23/1932 700/275 |
| 2017/0253374 | A1 | 9/2017 | Tunks et al. | |
| 2019/0332822 | A1 | 10/2019 | Shelnutt et al. | |
| 2021/0127523 | A1 | 4/2021 | Bailey | |
| 2022/0030744 | A1 | 1/2022 | Embleton et al. | |
| 2023/0106634 | A1 | 4/2023 | Dunne et al. | |

\* cited by examiner

*Primary Examiner* — Hung S. Bui
(74) *Attorney, Agent, or Firm* — Chamberlain Hrdlicka; Aly Z. Dossa

(57) ABSTRACT

A modular data center includes: a modular information technology component (MITC), in which the MITC includes a plurality of information handling systems (IHSs), a utility control component (UCC), and a first connection interface, in which the first connection interface includes a first set of mechanical and electrical connection components (MEC-COMs); and a modular environmental control component (MECC), in which the MECC includes a plurality of environmental control components (ECCs) and a second connection interface, in which the second connection interface includes a second set of MECCOMs to be paired with the first set of MECCOMs to generate at least a portion of the modular data center, and in which the first connection interface is connected to the second connection interface, in which an area enclosed by the first connection interface is equal to an area enclosed by the second connection interface.

17 Claims, 15 Drawing Sheets

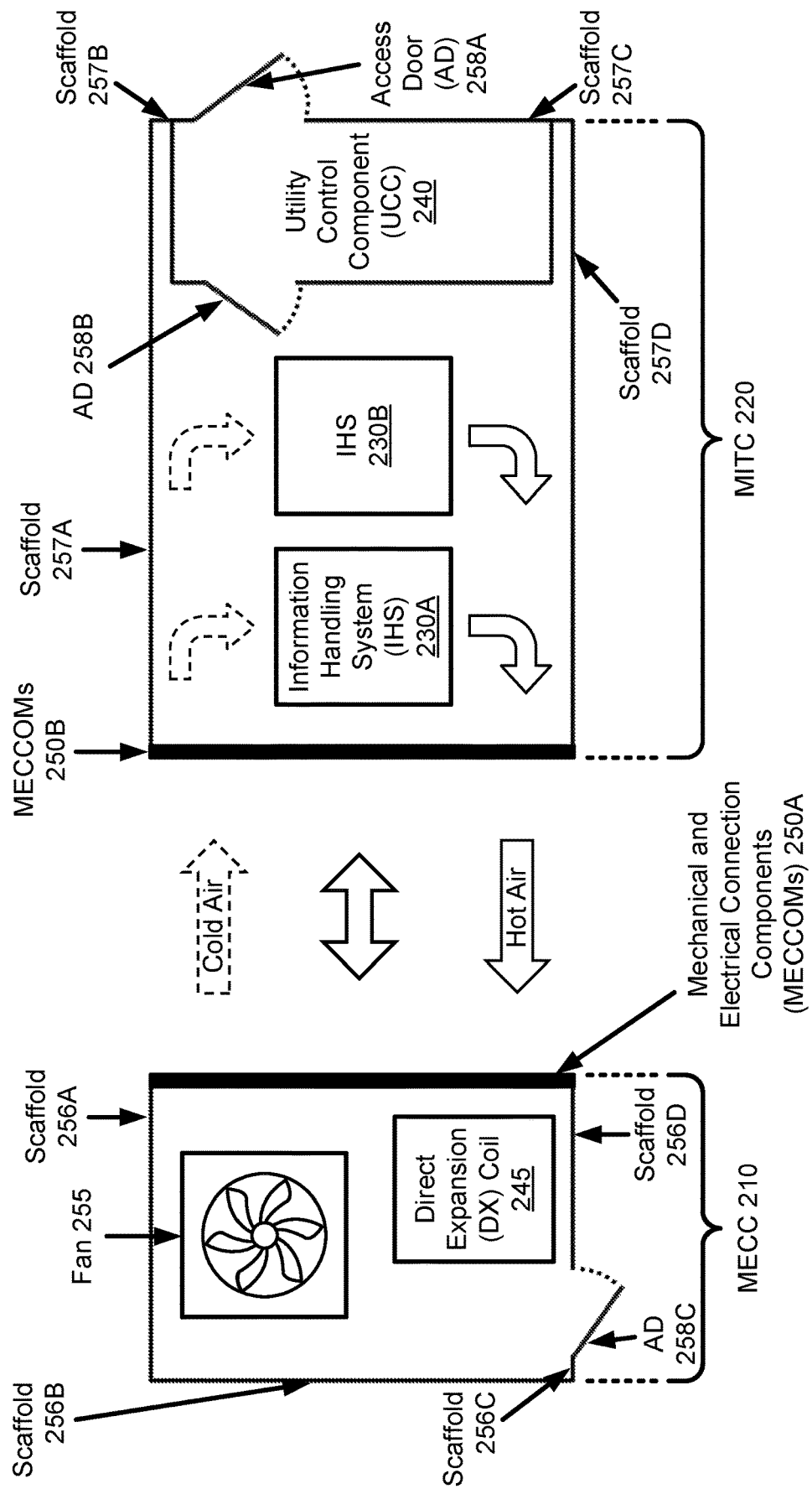
FIG. 2.1

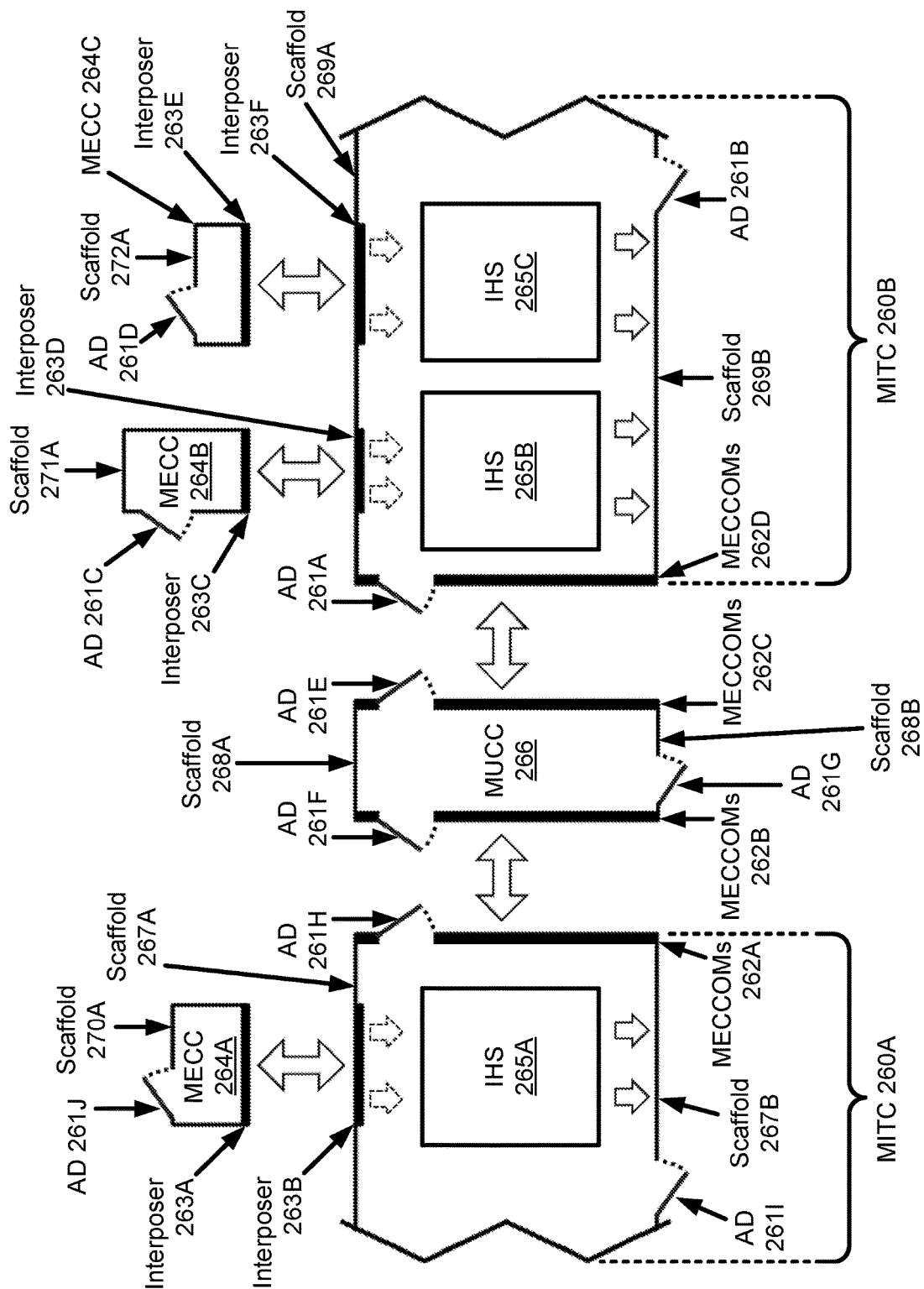
FIG. 2.2

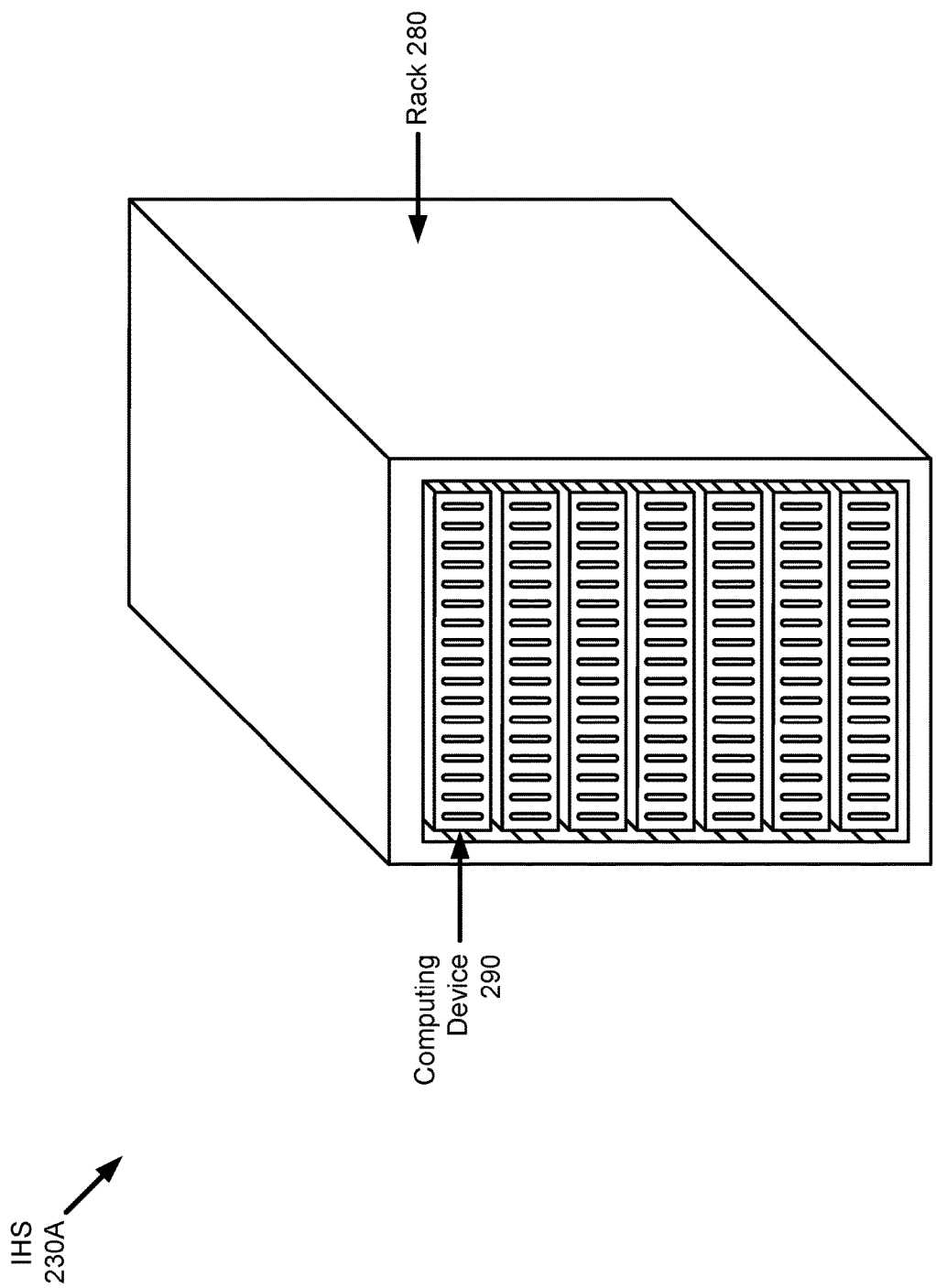
FIG. 2.3

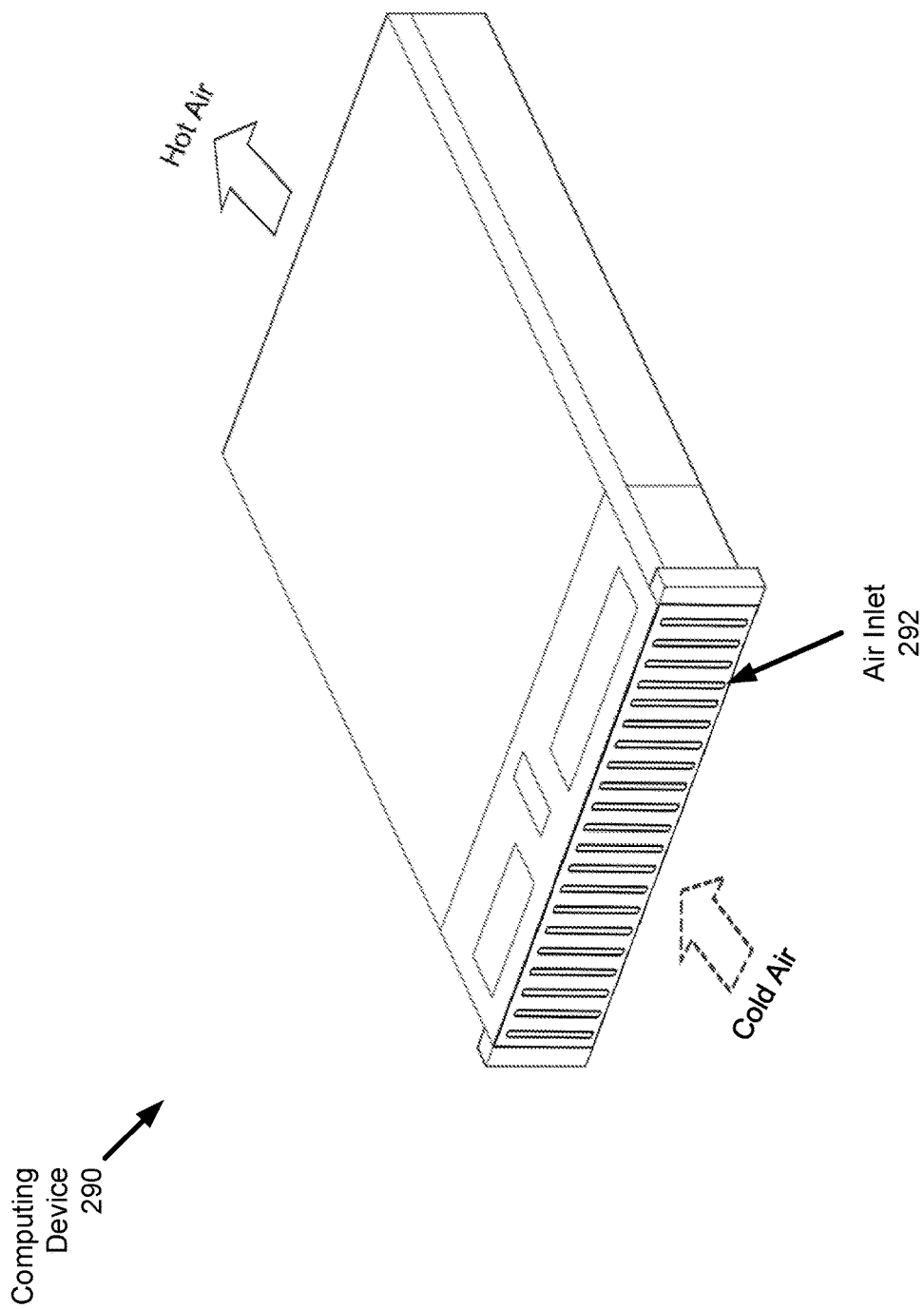
FIG. 2.4

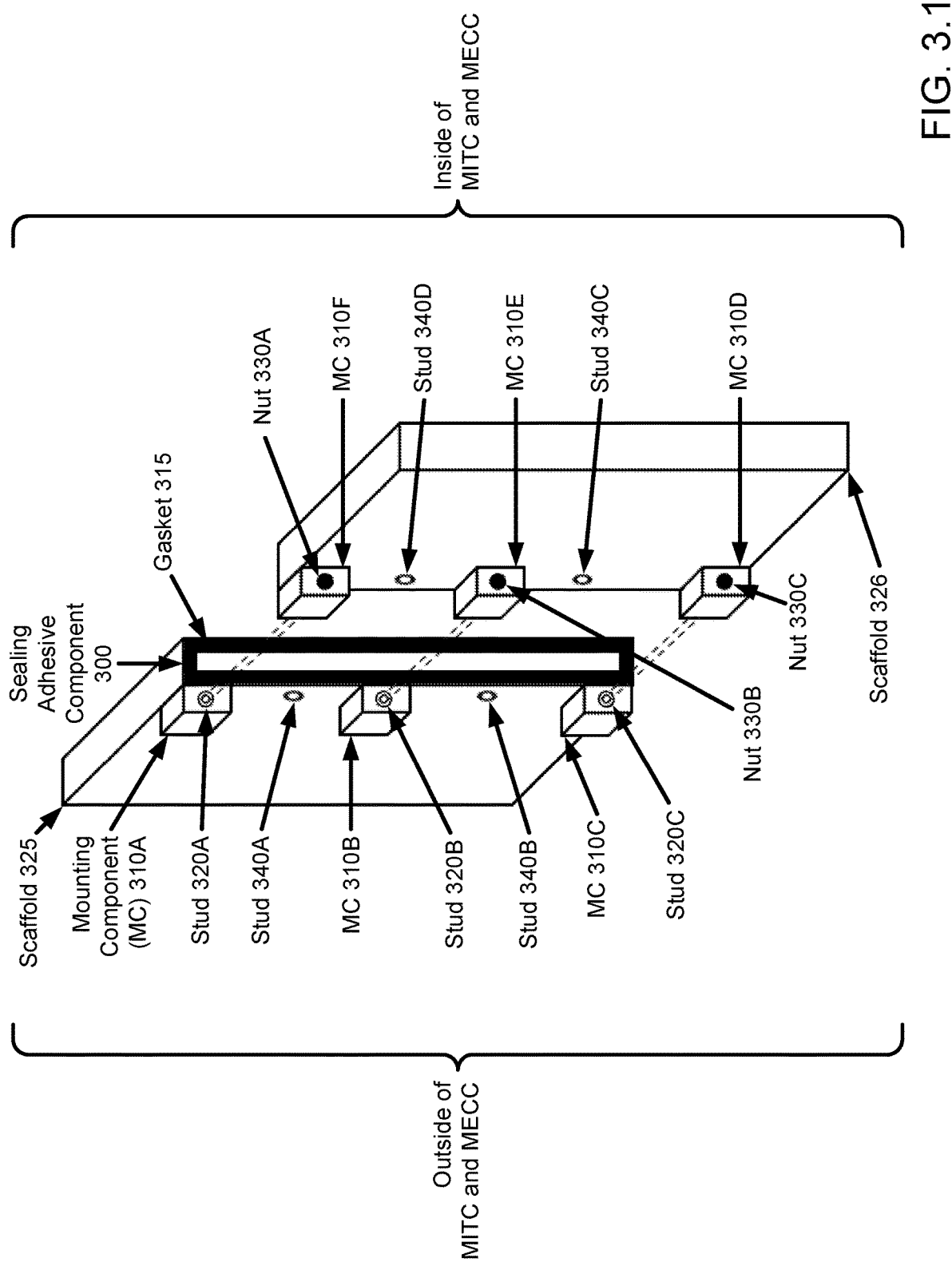
FIG. 3.1

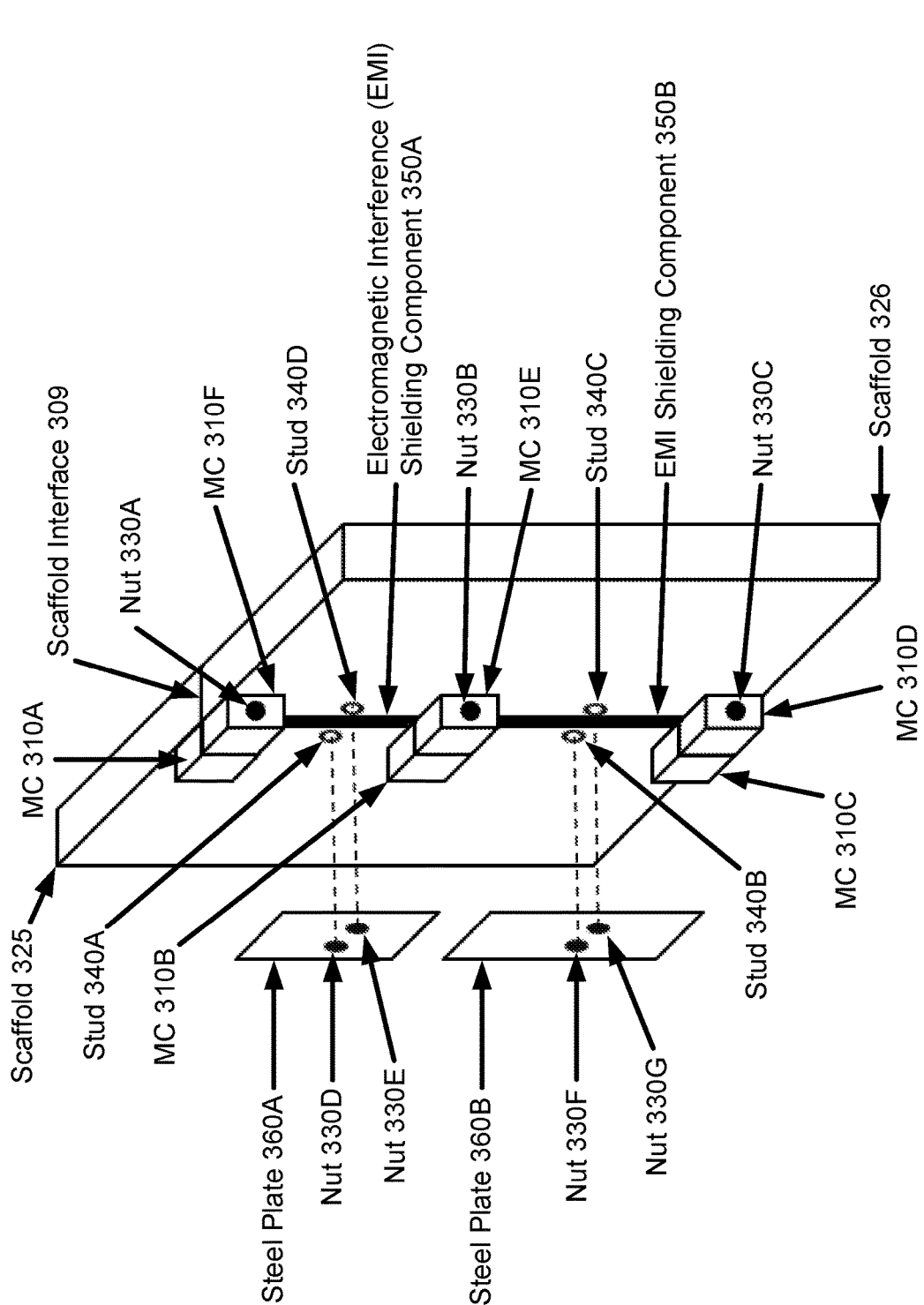
FIG. 3.2

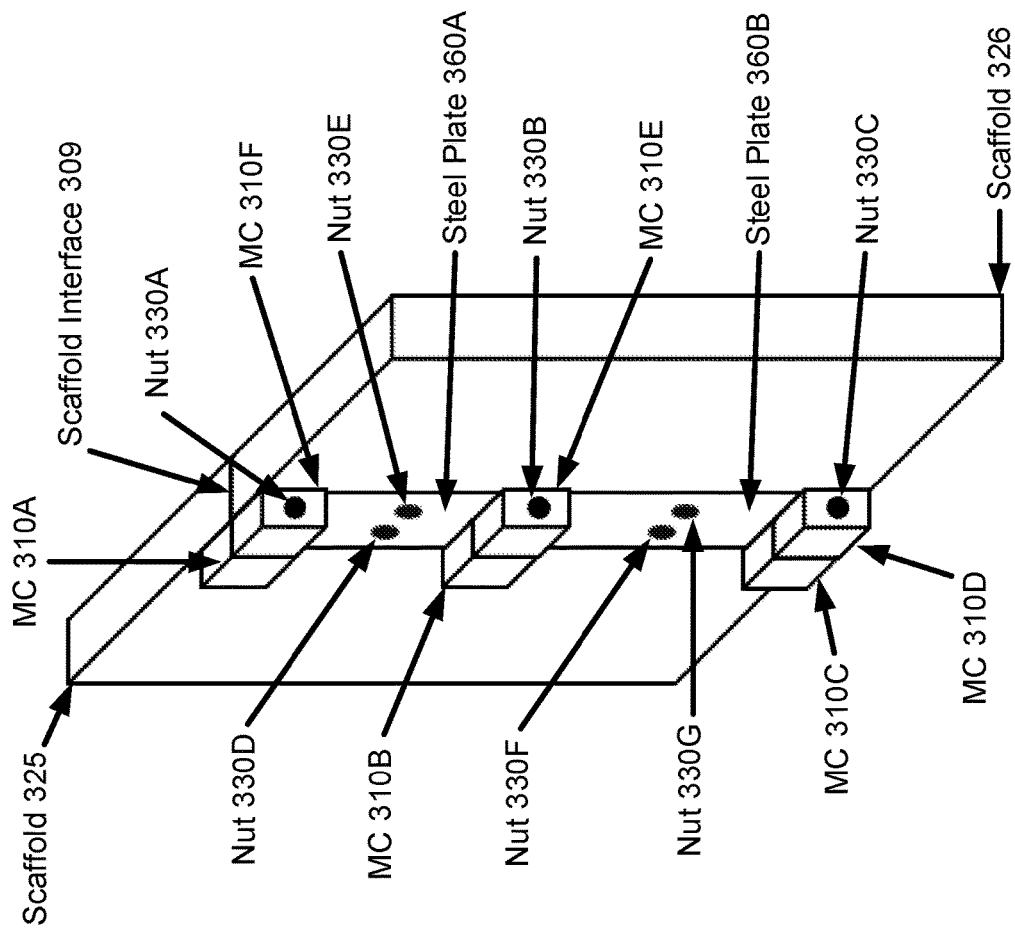
FIG. 3.3

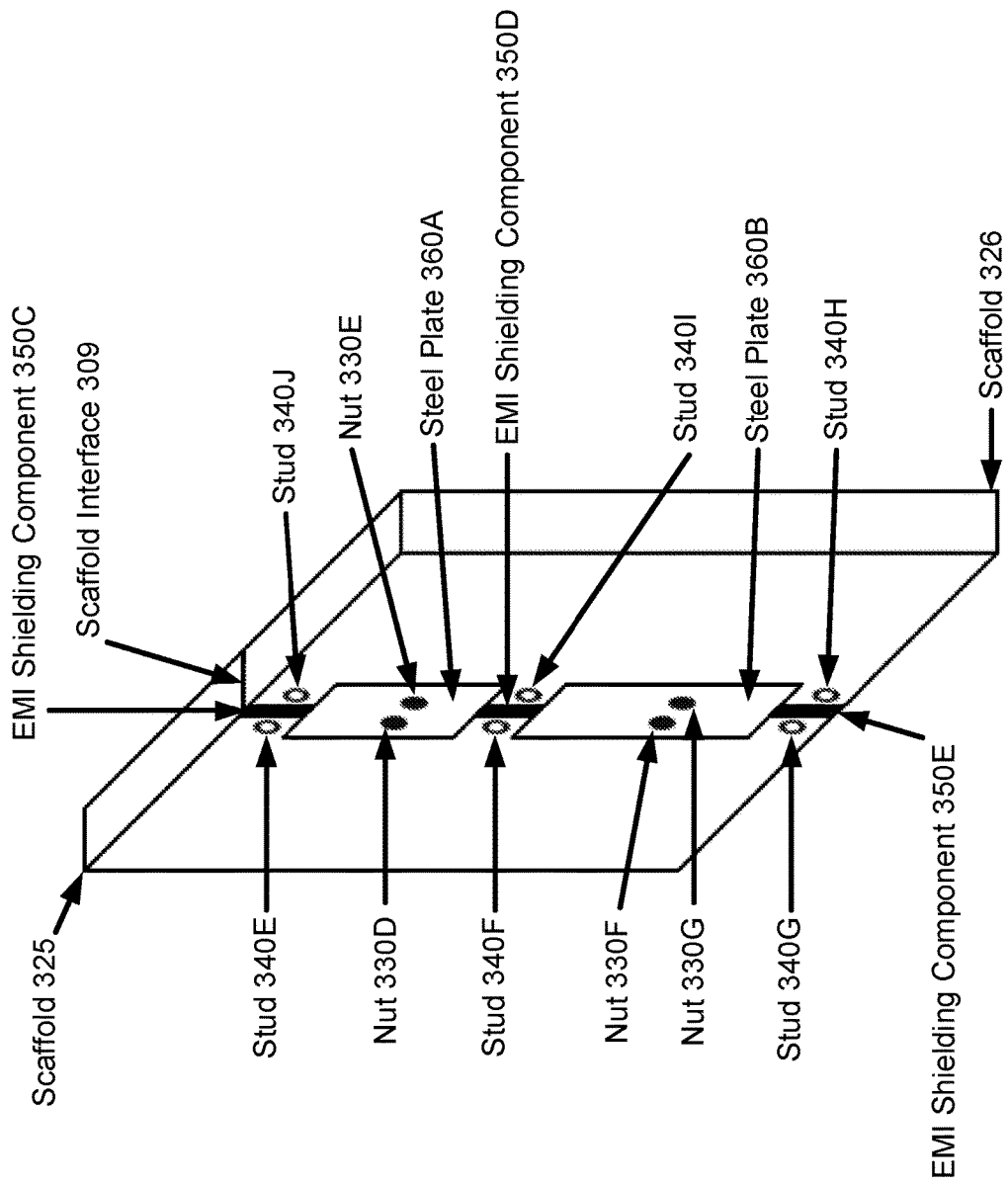
FIG. 3.4

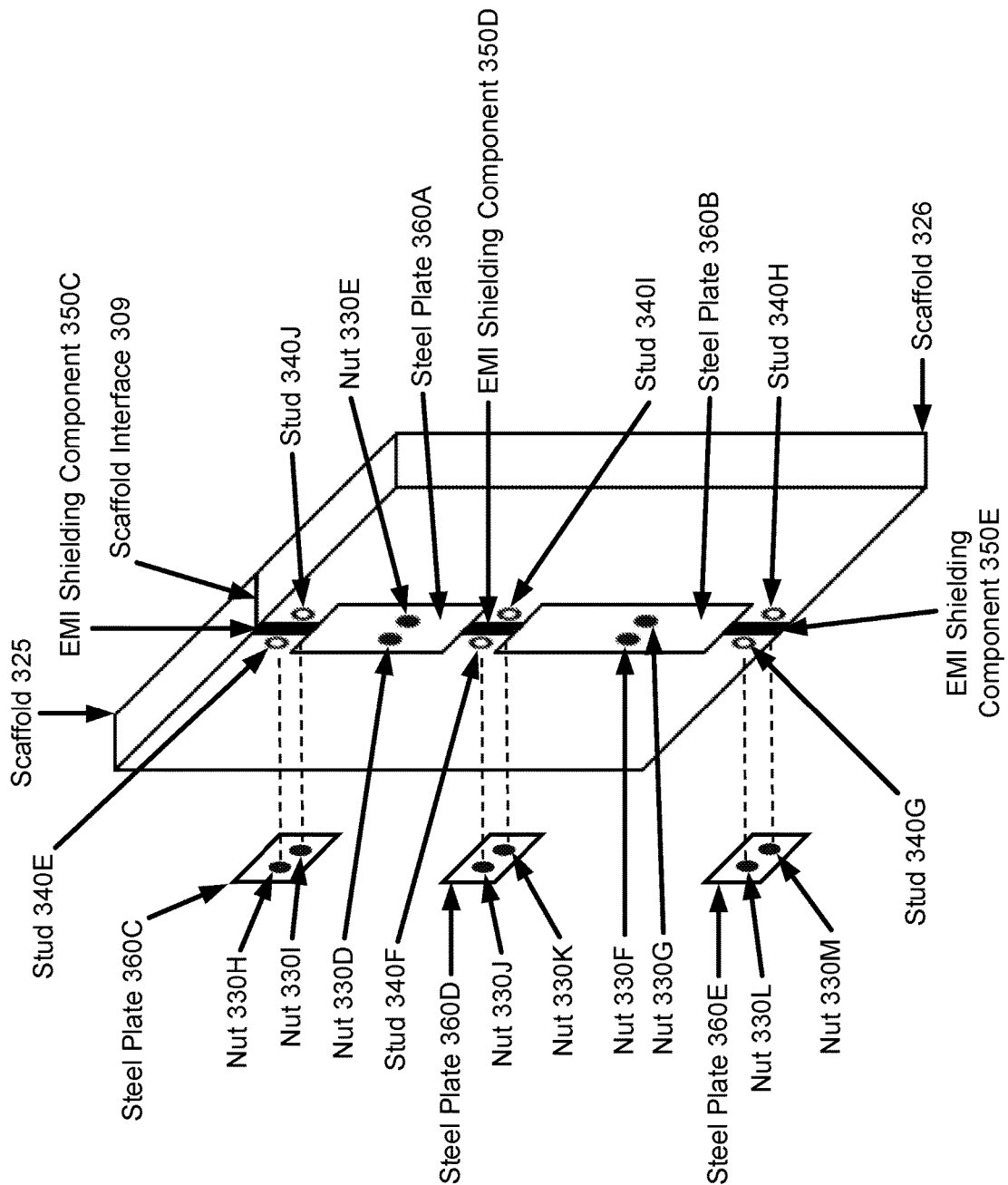
FIG. 3.5

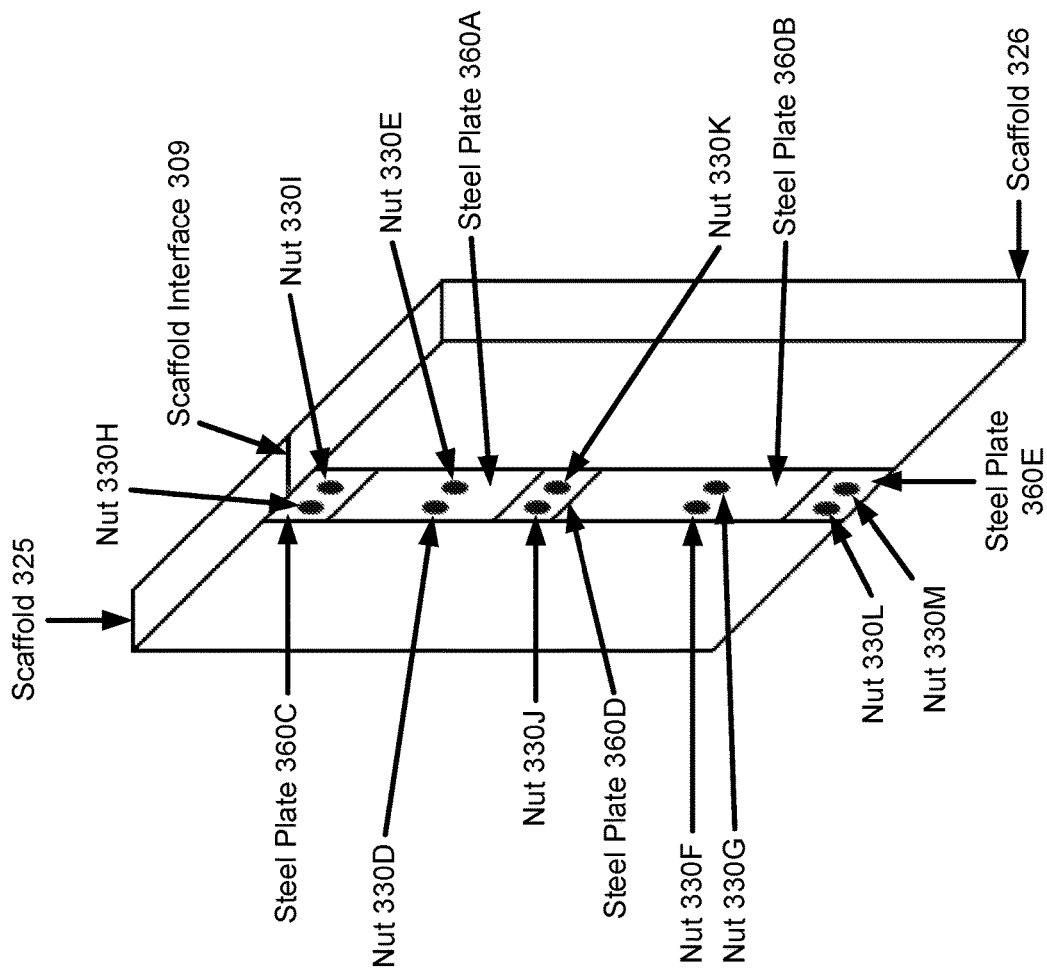
FIG. 3.6

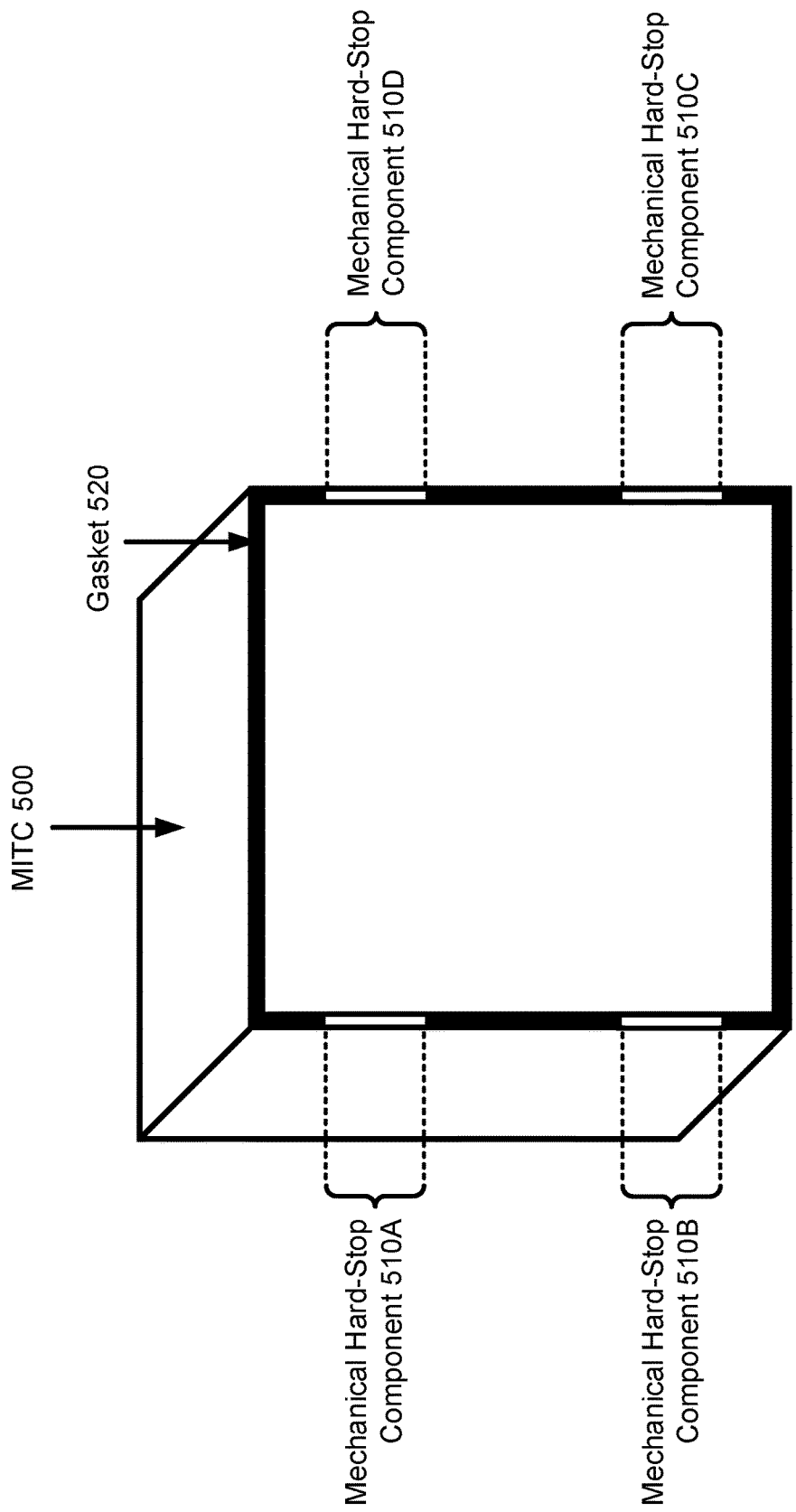
FIG. 5.1

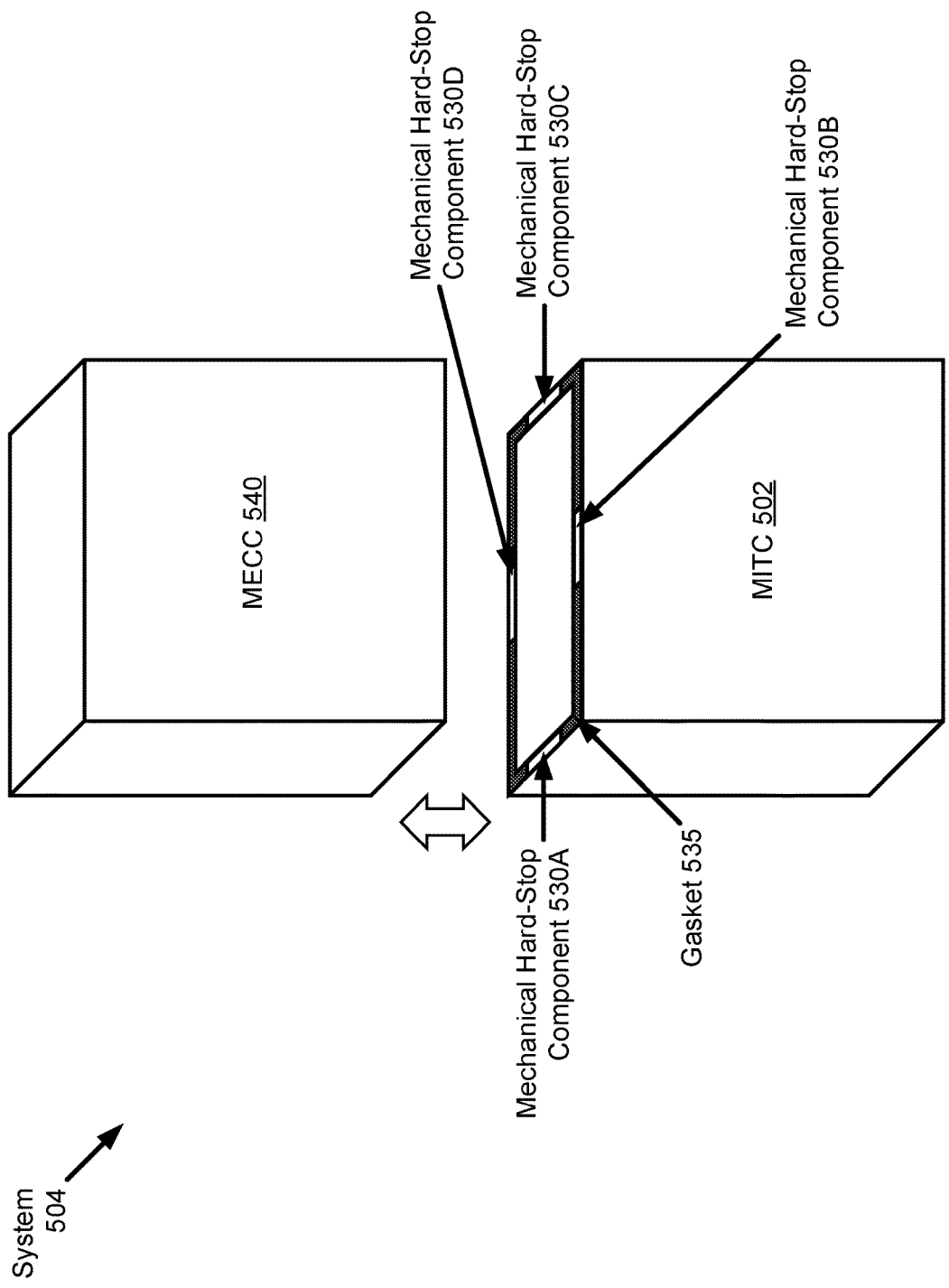
FIG. 5.2

MODULE-TO-MODULE MECHANICAL, ELECTRICAL, AND AIRFLOW CONNECTIONS IN MODULAR DATA CENTERS

BACKGROUND

The heterogeneous data center environments witnessed today often require a combination of various cooling, power, and information technology (IT) components. The cooling, power, and IT components are available either commercially with minimum configuration options (e.g., one-size-fits-all) or through a full custom solution for a specific customer demand. This either impacts scalability of the heterogeneous data center environments, or requires resource-intensive engineering for deployment of the cooling, power, and IT components.

BRIEF DESCRIPTION OF DRAWINGS

Certain embodiments of the invention will be described with reference to the accompanying drawings. However, the accompanying drawings illustrate only certain aspects or implementations of the invention by way of example, and are not meant to limit the scope of the claims.

FIG. 2.1 shows a top view of the system of FIG. 1 in accordance with one or more embodiments of the invention.

FIG. 2.2 shows a top view of a system in accordance with one or more embodiments of the invention.

FIG. 2.3 shows a diagram of an information handling system (IHS) in accordance with one or more embodiments of the invention.

FIG. 2.4 shows a diagram of a computing device in accordance with one or more embodiments of the invention.

FIGS. 3.1-3.6 show a pairing process of a portion of a connection interface of a modular information technology component (MITC) and a portion of a connection interface of a modular environmental control component (MECC) in accordance with one or more embodiments of the invention.

FIG. 5.1 shows a connection interface of an MITC in accordance with one or more embodiments of the invention.

FIG. 5.2 shows a diagram of a MECC that is stacked on top of an MITC in accordance with one or more embodiments of the invention.

DETAILED DESCRIPTION

Figure 1:
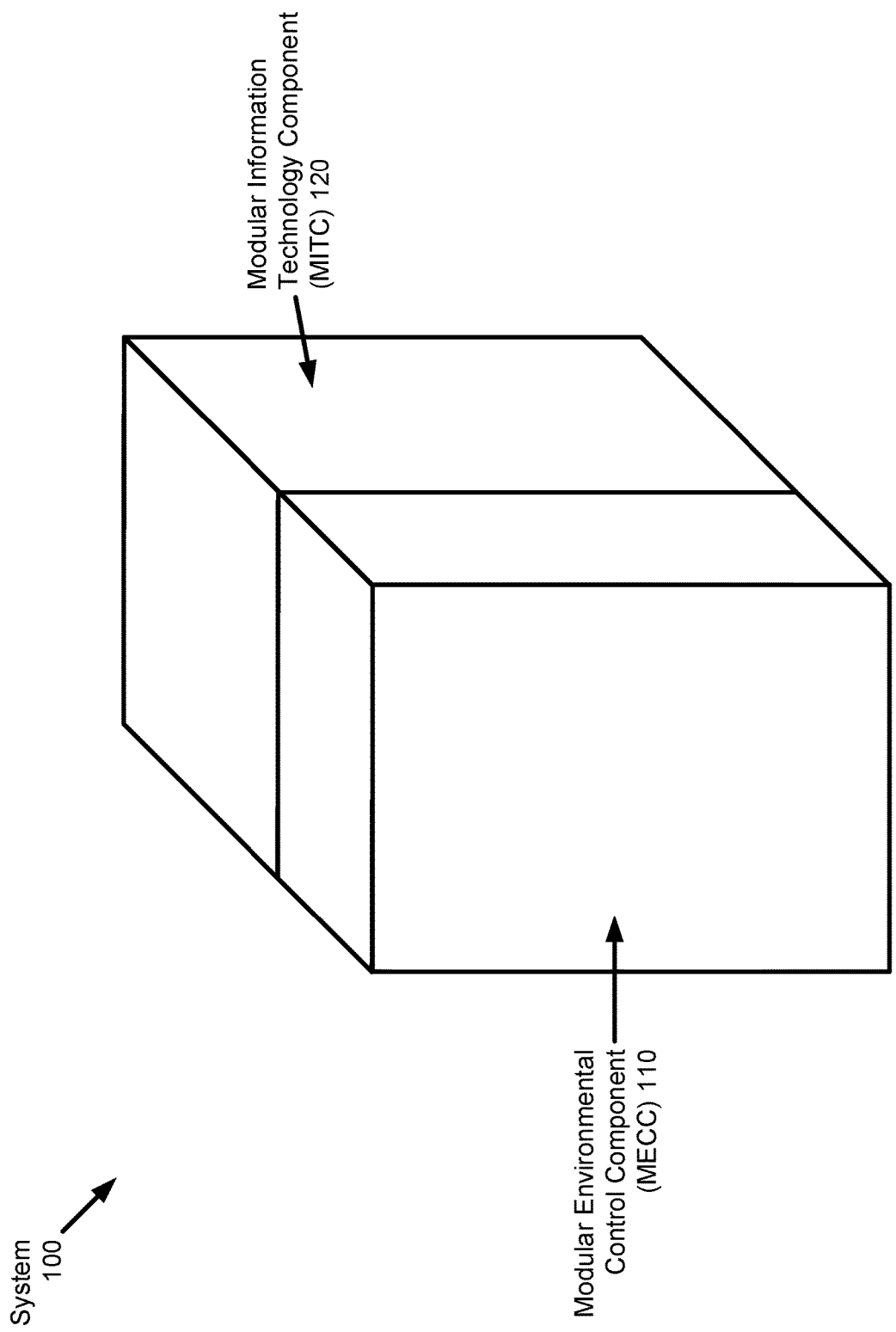
FIG. 1 shows a diagram of a system in accordance with one or more embodiments of the invention.

Specific embodiments of the invention will now be described in detail with reference to the accompanying figures. In the following detailed description of the embodiments of the invention, numerous specific details are set forth in order to provide a more thorough understanding of one or more embodiments of the invention. However, it will be apparent to one of ordinary skill in the art that one or more embodiments of the invention may be practiced without these specific details. In other instances, well-known features have not been described in detail to avoid unnecessarily complicating the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

Throughout this application, elements of figures may be labeled as A to N. As used herein, the aforementioned labeling means that the element may include any number of items, and does not require that the element include the same number of elements as any other item labeled as A to N. For example, a data structure may include a first element labeled as A and a second element labeled as N. This labeling convention means that the data structure may include any number of the elements. A second data structure, also labeled as A to N, may also include any number of elements. The number of elements of the first data structure, and the number of elements of the second data structure, may be the same or different.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

As used herein, the phrase operatively connected, or operative connection, means that there exists between elements/components/devices a direct or indirect connection that allows the elements to interact with one another in some way. For example, the phrase 'operatively connected' may refer to any direct connection (e.g., wired directly between two devices or components) or indirect connection (e.g., wired and/or wireless connections between any number of devices or components connecting the operatively connected devices). Thus, any path through which information may travel may be considered an operative connection.

In general, a customer using a modular data center for high performance computing may experience issues relate to installing (e.g., establishing) compatible mechanical, electrical, and airflow connections between paired components (e.g., an MITC, a MECC, etc.) of the modular data center. Typically, an ability to pair (e.g., to assemble) components that have different form factors requires resource (e.g., engineering, manufacturing, procurement, etc.) intensive efforts.

To address one or more of the aforementioned issues, embodiments of the invention provide a pairing methodology (e.g., a pairing process) on how to pair the components into a cohesive modular data center. More specifically, embodiments of the invention describe how to install the compatible mechanical, electrical, and airflow connections between the paired components to generate the cohesive modular data center. This advantageously minimizes the resource-intensive efforts while pairing the components into the cohesive modular data center or while expanding an existing modular data center.

The following describes various embodiments of the invention.

As used herein, a "modular data center" includes any facility or a portion of a facility in which computing operations are carried out. A modular data center may include IHSs and IHS components coupled together as functional IHSs, in which the IHSs and the functional IHSs are dedicated to serve specific functions or to serve multiple functions. Examples of computing operations may include (but not limited to): information processing, communications, testing, simulations, power distribution and control, operational control, etc.

Turning now to FIG. 1, FIG. 1 shows a diagram of a system (100) in accordance with one or more embodiments of the invention. The system (100) includes an MITC (120) and a MECC (110). The system (100) may include additional, fewer, and/or different components (e.g., modular building blocks) without departing from the scope of the invention. Each component illustrated in FIG. 1 is described below in reference to FIG. 2.1.

Turning now to FIG. 2.1, FIG. 2.1 shows a top view of the system of FIG. 1 in accordance with one or more embodiments of the invention. In an embodiment of the invention shown in FIG. 2.1, the MITC (220) may be a mechanical structure that enables one or more IHSs (230A, 230B) and a utility control component (UCC) (240) to be disposed within the MITC (220).

In one or more embodiments, while disposing, the IHSs (230A, 230B) may be affixed to a floor (not shown) within the MITC (220) via standard mechanical mechanisms (e.g., bolts, screws, nuts, studs, etc.). In one or more embodiments, the floor is affixed to a bottom side of the MITC (220). Other mechanical or non-mechanical (e.g., glue, an adhesive tape, etc.) mechanisms for affixing the IHSs (230A, 230B) to the floor may be used without departing from the scope of the invention.

In one or more embodiments, a white space within the MITC (220), where the IHSs (230A, 230B) are located, may have a functionality to host different types of standard racks (e.g., 4×750 millimeter (mm) wide racks, 5×600 mm wide racks, 5×48 rack unit (RU) racks, etc.). As a unit of measurement, the RU is equal to 1.75 inches and the RU defines an increment within a standard rack. The white space may also have a functionality to host custom designed racks. Both standard (e.g., off-the-shelf) racks and custom designed racks may be pre-integrated into the floor before transportation to a customer site (e.g., a customer location, a customer facility, etc.).

In one or more embodiments, apart from hosting the IHSs (230A, 230B), the white space may also host other components, for example (but not limited to): immersion tanks, uninterruptible power supplies (UPSs), battery racks, cable management towers, cooling distribution units (CDUs), etc.

The aforementioned example is not intended to limit the scope of the invention.

In one or more embodiments, the MITC (220) may be implemented as other types of structures adapted to host, position, orient, and/or otherwise physically, mechanically, electrically, and/or thermally manage the IHSs (230A, 230B) and the UCC (240). In this manner, the MITC (220) may enable the IHSs (230A, 230B) and the UCC (240) to be densely packed without negatively impacting the operation of the IHSs (230A, 230B) and the UCC (240).

In one or more embodiments, an IHS (e.g., 230A) may include a rack and any number of computing devices. Additional details of the IHS are described below in reference to FIGS. 2.3 and 2.4.

In one or more embodiments, the UCC (240) is integrated within the MITC (220) to support different types of IHSs, in which the UCC-integrated MITC is manufactured as a monolithic system. This implies that the UCC (240) is not a separate, standalone component.

In one or more embodiments, the UCC (240) may include one or more physical devices (e.g., panels, units, switchboards, etc.) that may provide functionality, for example (but not limited to): to detect a temperature within a system, to detect fire/smoke within a system, to suppress fire/smoke within a system, to provide an access control to a component, to manage a power distribution to a component, to manage a temperature within a system, etc.

The aforementioned example is not intended to limit the scope of the invention.

In one or more embodiments, the UCC (240) may include an environmental control component (ECC) control panel (not shown) that is configured to manage a temperature within the system (e.g., 100, FIG. 1) and to provide heating and/or cooling control services. The heating and/or cooling control services may include, for example (but not limited to): (i) obtaining information relating to a temperature of one or more components within the system (e.g., 100, FIG. 1), where the information may be obtained through a number of temperature sensors (discussed below) within the system (e.g., 100, FIG. 1), (ii) determining whether the temperature within the system (e.g., 100, FIG. 1) is below or above an appropriate operating temperature level (e.g., above 0° C.), (iii) initiating, based on the determination in (ii), a heating process (e.g., activating a heater component within a MECC (210)) to bring the IHSs (230A, 230B) into their designed operating temperature levels, (iv) initiating, based on the determination in (ii), a cooling process (e.g., activating a fluid mixture unit within the MECC (210)) to bring the IHSs (230A, 230B) into their designed operating temperature levels, (v) preventing damage (e.g., thermal runaway) to the heater component in the event of overheating, etc.

While described as a physical device, the ECC control panel may be implemented as a logical entity (e.g., a program executing using a number of printed circuit board components (not shown)). For example, an IHS (e.g., 230A) may host a program that provides the functionality of the ECC control panel.

In one or more embodiments, the ECC control panel may include one or more temperature sensors. The ECC control panel may include other types of sensors (e.g., humidity sensors, vibration sensors, corrosion sensors, differential pressure sensors, etc.) without departing from the scope of the invention. In one or more embodiments, one end of a temperature sensor may be operatively connected to at least one of the components (e.g., IHSs (230A, 230B)) within the system (e.g., 100, FIG. 1) to detect a temperature within the system (e.g., 100, FIG. 1). The other end of the temperature sensor may be operatively connected to the ECC control panel, in which the ECC control panel is configured to manage the components based on the temperature within the system (e.g., 100, FIG. 1).

In one or more embodiments, the UCC (240) may include a power distribution control unit (not shown) that is configured to determine which component(s) within the system (e.g., 100, FIG. 1) receive power from a modular power supply component (not shown). For example, when the heater component needs to be activated, the modular power supply component may be instructed (e.g., by the power distribution control unit) to distribute power to the heater component. As yet another example, the modular power supply component may be instructed to distribute power to the IHSs (230A, 230B).

In one or more embodiments, the modular power supply component may be designed by considering geographic factors of the customer site and custom requirements of the customer. The factors and the requirements may include, for example (but not limited to): a hurricane rating of a location, a required number of UPSs to support an operation, a required number of physical devices in a MECC, a required resiliency of a MECC, a required input power frequency, a required input voltage, etc.

The aforementioned examples are not intended to limit the scope of the invention.

In one or more embodiments, the modular power supply component may obtain customer facility's power (which comes from a centralized power station) and then may distribute the power (i.e., provide the power) to one or more components of the system (e.g., 100, FIG. 1).

In one or more embodiments, the modular power supply component may provide DC power to the components. The modular power supply component may include functionality to convert AC power (obtained from the centralized power station) to DC power.

In one or more embodiments, the modular power supply component may provide "N" or "2×N" power supply resiliency. In one or more embodiments, "N" resiliency may refer to having an exact number of components to operate. For example, if the system (e.g., 100, FIG. 1) needs "N" components to operate and if the system (e.g., 100, FIG. 1) has "N" components, this means that the system (e.g., 100, FIG. 1) has "N" resiliency. As yet another example, if the system (e.g., 100, FIG. 1) has "2×N" power supply resiliency, this means that the modular power supply component has a functionality to provide twice the amount of power needed for the system (e.g., 100, FIG. 1).

Further, if the modular power supply component provides a single power supply feed, then the system (e.g., 100, FIG. 1) will have a low level of resiliency. If there is an additional power supply feed (e.g., a separate busway), then the system (e.g., 100, FIG. 1) will have a high level of resiliency. Having an additional power capacity (e.g., having a redundant UPS, having a redundant battery, etc.) may ensure that the system (e.g., 100, FIG. 1) has no downtime while performing a service maintenance or experiencing a failure (e.g., a hardware failure, a software failure, etc.).

In one or more embodiments, apart from the modular power supply component, the power distribution control unit may include one or more backup power resources (e.g., batteries) to support an uninterrupted service (e.g., a temperature detection service, a power distribution management service, etc.) of the UCC (240).

In one or more embodiments, the UCC (240) may also include an access control unit (not shown) that is configured to control one or more security devices that are placed at various locations on the system (e.g., 100, FIG. 1). In one or more embodiments, a security device may be, for example (but not limited to): a padlock, a badge reader, an electrified mortise lock, a biometric reader-based access contact, etc. By using, for example, a biometric reader-based access contact, the access control unit may control access provided by access doors (ADs, discussed below) (258A-258C).

The aforementioned example is not intended to limit the scope of the invention.

In one or more embodiments, the access control unit may include a blank space (with power) to plug-in third-party security devices. If a customer has an existing security system at a customer site, the customer may install (e.g., mount) the existing security system within the blank space. In this manner, the customer may have a flexibility to use built-in security devices of the UCC (240) and/or to use the existing security system for access control.

As used herein, "mounting" a particular component on another component refers to positioning the particular component to be in physical contact with the other component, such that the other component provides structural support, positioning, structural load transfer, stabilization, shock absorption, some combination thereof, or the like with regard to the particular component.

Those skilled in the art will appreciate that while the IHSs (230A, 230B) and the UCC (240) are shown as located on a particular side of the MITC (220), the IHSs (230A, 230B) and the UCC (240) may be located on any other side of the MITC (220) without departing from the scope of the invention.

In one or more embodiments, the MITC (220) includes the AD (258A). Similarly, the UCC (240) includes the AD (258B). In one or more embodiments, the ADs (258A, 258B) may be walk-in doors or walk-up doors. For example, as a walk-in door, the AD (258A) may permit user access to the UCC (240). As yet another example, as a walk-in door, the AD (258B) may permit user access to an internal environment of the MITC (220).

The aforementioned examples are not intended to limit the scope of the invention.

In one or more embodiments, a walk-up door may be a mechanical "reach through" structure, in which "walk-up" refers to not being able to walk inside of, for example, the MECC (210). Said another way, the walk-up door (258C) has not enough space for a customer to step inside of the MECC (210). However, using the walk-up door (258C), the customer may access substantially a portion of an ECC (e.g., a direct expansion (DX) coil (245)) to perform a service type of event.

In one or more embodiments, the service type of event may include, for example (but not limited to): changing an actuator, changing a filter, changing a sensor, etc. In one or more embodiments, because the customer not being able to walk inside of the MECC (210), the customer may perform the event while standing outside of the MECC (210).

The aforementioned examples are not intended to limit the scope of the invention.

In one or more embodiments, a walk-in door may be a mechanical "walk through" structure, in which "walk-in" refers to being able to walk inside of, for example, the MECC (210) to perform at least a service type of event. In one or more embodiments, the walk-in door has a greater depth than the walk-up door. Said another way, the walk-in door has enough space (e.g., a walk-in space) for a customer to step inside of the walk-in door.

In one or more embodiments, for example, the AD (258A) includes a handle (not shown) that makes easier to open or close the AD (258A) to walk through or reach through the internal environment of the MITC (220). In this manner, the customer may perform a service type of event without standing outside of the MITC (220).

The aforementioned example is not intended to limit the scope of the invention.

In one or more embodiments, the ADs (258A-258C) may be wicket doors (e.g., a door in a door), in which the ADs (258A-258C) both include a person door and a rack door.

This means that the ADs (258A-258C) are big enough to pass a rack (not shown) through the ADs (258A-258C). In one or more embodiments, dotted arcs show an inward rotation or an outward rotation of the ADs (258A-258C).

Those skilled in the art will appreciate that while the ADs (258A, 258B) are shown as located on a rear side of the MITC (220) and a front side of the UCC (240), respectively, the ADs (258A, 258B) may be located on any other side of the MITC (220) and the UCC (240) without departing from the scope of the invention.

In one or more embodiments, the MITC (220) includes a connection interface, in which the connection interface is affixed to a pairing end of the MITC (220). The pairing end of the MITC (220) refers to a portion of the MITC (220) that can be paired with another component (e.g., the MECC (210)). In one or more embodiments, the connection interface of the MITC (220) includes mechanical and electrical connection components (MECCOMs) (250B). The connection interface of the MITC (220) also includes built-in airflow connection components (discussed below). Additional details of the MECCOMs are described below in reference to FIGS. 3.1-5.2.

In one or more embodiments, an area (e.g., height×width) enclosed by the connection interface of the MITC (220) is equal to an area enclosed by a connection interface of the MECC (210) (discussed below). In this manner, an end-to-end pairing between the MITC (220) and the MECC (210) may be installed for compatible mechanical, electrical, and airflow connections.

The MECC (210) may include one or more physical devices (e.g., ECCs) that alter characteristics (e.g., airflow directions, humidity of air, and temperature levels, etc.) of the internal environment of the MITC (220) at a macroscopic level. The physical devices may also ensure reliability of the IHSs (230A, 230B) and the UCC (240). In one or more embodiments, the physical devices may be affixed to a floor (e.g., a bottom side) of the MECC (210). In one or more embodiments, a physical device may be, for example (but not limited to): a fan (255), a DX coil (245), a fluid mixture unit, a heater component, an immersion cooling component, etc.

The aforementioned example is not intended to limit the scope of the invention.

In some cases, the system (e.g., 100, FIG. 1) may be deployed to environments that result in the temperature levels of the IHSs (230A, 230B) and the UCC (240) being outside of their designed operating temperature levels. For example, the IHSs (230A, 230B) may be designed to operate at temperature levels above 0° C. When the system (e.g., 100, FIG. 1) is deployed to an environment with harsh conditions (e.g., −40° C.-60° C.), the IHS (230A, 230B) may not operate properly and, in certain scenarios, may be damaged. To prevent the aforementioned issue, depending on environmental conditions, the physical devices either cool or heat the internal environment of the MITC (220). In this manner, stability and functionality of the IHSs (230A, 230B) and the UCC (240) may be preserved.

In one or more embodiments, as a gas mover, the fan (255) may be able to change a rate of gases being taken into and expelled from the IHSs (230A, 230B) and the UCC (240). As a refrigerant-based cooling technology, the DX coil (245) may cool the internal environment of the MITC (220) using a condensed refrigerant liquid (e.g., liquid nitrogen, hydrofluorocarbons (HFCs), etc.). In this technology, the refrigerant may expand to generate a cooling effect in the DX coil (245) that is in direct contact with a conditioned air, which will be supplied to the internal environment of the MITC (220).

In one or more embodiments, as a liquid cooling component, the fluid mixture unit may pump cooled fluid mixture (e.g., a mixture of water and glycerol) throughout hardware components (not shown) of the IHSs (230A, 230B) and the UCC (240). An absorbed air by the fluid mixture may then be transferred to an external environment of the MITC (220). Similar to refrigerant-based cooling technology, the fluid mixture unit may also use a DX coil; however, instead of using a refrigerant, the fluid mixture unit uses the fluid mixture. In one or more embodiments, glycerol may behave like an antifreeze liquid, in which the fluid mixture may operate at temperatures below 0° C.

In one or more embodiments, the MECC (210) may also take advantage of a cooling infrastructure that is already built-in at a customer site. For example, the MECC (210) may use a chilled water loop that is already available at the customer site.

As used herein, an "infrastructure" means system, components, or elements of a system that provide resources for a computing device, such as electrical power, data exchange capability with external systems, air, heat removal, and environmental control.

In one or more embodiments, the heater component may bring hardware components of the IHSs (230A, 230B) and the UCC (240) into their appropriate operating temperature levels (e.g., above 0° C.) when necessary. To initiate a heating process, the heater component may obtain a required power from the modular power supply component. The heater component may be made of silicon rubber, any other material, and/or any combination thereof that enables the heater component to perform its functions. Those skilled in the art will appreciate that the heater component may be supplied with power directly or indirectly (e.g., via a heating control component, a printed circuit board, etc.) without departing from the scope of the invention.

In one or more embodiments, the heater component has a number of surfaces that is heated and when air passes through the surfaces, an induced heat may be transferred from the heater component to the volume of air drawn into the internal environment of the MITC (220). In one or more embodiments, a number of heat sinks (not shown) may be used to provide a uniform distribution of heated volume of air drawn into the internal environment of the MITC (220) through their fins, in which a bottom portion of the number of heat sinks is affixed to the heater component. In this manner, a surface area of the heater component may be expanded indirectly to increase an efficiency of the heater component.

In one or more embodiments, the airflow connection components may be ducting components that allow using either standard or custom designed MECCs. The airflow connection components may change (e.g., twist) a direction of an airflow formed between the MECC (210) and the MITC (220). For example, the MECC (210) may include a cold air ducting component and a hot air ducting component. The cold air ducting component may supply cold air into the MITC (220). The hot air ducting component may remove hot air from the MITC (220) and may deliver the hot air to the MECC (210).

The aforementioned example is not intended to limit the scope of the invention.

As used herein, a "ducting component" includes any tube, pipe, conduit, or a combination thereof, that has one or more passageways through which a fluid or a gas can be conveyed. Examples of materials for a ducting component may include a cloth, a fabric, an extruded metal, a sheet metal, a polymer, or a combination thereof. A passageway of a ducting component may have any size and shape. The cross-section of a ducting component may be square, round, ovate, rectangular, or irregular. Further, a passageway of a ducting component may have a constant or changing cross-section or a cross-section that changes over the length of the passageway.

In one or more embodiments, the MECC (210) may provide "N+1" or "N+2" heating and/or cooling resiliency. In one or more embodiments, "N+1" cooling resiliency may indicate that even if one of the physical devices is deactivated (because of a service maintenance), the IHSs (230A, 230B) may still operate. For example, the MECC (210) has four fans and the MECC (210) has "N+1" resiliency. In this case, the required number of fans to support operation of the IHSs (230A, 230B) is three and the MECC (210) has a redundant fan. Having additional heating and/or cooling capacity (e.g., having a redundant fan, having a redundant heater component, etc.) may ensure that the IHSs (230A, 230B) has no downtime while performing a service maintenance or experiencing a failure.

In one or more embodiments, a power usage effectiveness (PUE) value of a component (e.g., an ECC, an IHS, etc.) at a data center indicates how energy efficient the component is. For example, as an ideal case, if a PUE value of an ECC is equal to one, this means that the ECC uses 100% of an input power that is provided to the ECC. In general, a PUE value of an ECC at a traditional data center is on average 1.57 (e.g., 64% effectiveness). Comparing to the PUE value of the ECC at the traditional data center, a PUE value of the MECC (210) is on average 1.01 (e.g., 99% efficiency)-1.043 (e.g., 95% efficiency), depending on where the system (e.g., 100, FIG. 1) is deployed. For example, if the system (e.g., 100, FIG. 1) is deployed to a hot environment (e.g., Phoenix, AZ), the PUE value of the MECC (210) may be 1.043. As yet another example, if the system (e.g., 100, FIG. 1) is deployed to a mild (e.g., neither hot nor cold) environment (e.g. San Diego, CA), the PUE value of the MECC (210) may be 1.01.

The aforementioned example is not intended to limit the scope of the invention.

In one or more embodiments, the MECC (210) supplies cold air (shown with a dashed line arrow) to the internal environment of the MITC (220) (including the UCC (240)) via the built-in airflow connection components. The MECC (210) also removes hot air (shown with a solid line arrow) from the internal environment of the MITC (220) (including the UCC (240)) via the built-in airflow connection components. In one or more embodiments, the dashed line and the solid line arrows inside of the MITC (220) may be referred to as a "cold aisle" and a "hot aisle", respectively.

The cold aisle may refer to an area (e.g., a space) in which conditioned (e.g., cold) air is introduced to a front side of the IHSs (230A, 230B) and to the UCC (240) to remove heat. The cold air may also be introduced to other components located within the internal environment of the MITC (220) without departing from the scope of the invention.

The hot aisle may refer to an area in which conditioned (e.g., hot) air is removed from a rear side of the IHSs (230A, 230B) and from the UCC (240) for the reliability of the IHSs (230A, 230B) and the UCC (240). The hot air may also be removed from other components located within the internal environment of the MITC (220) without departing from the scope of the invention.

In one or more embodiments, similar to MITC (220), the MECC (210) includes the AD (258C). In one or more embodiments, the AD (258C) may be a walk-in door or a walk-up door (as discussed above). For example, as a walk-in door, the AD (258C) may permit user access to the MECC (210).

The aforementioned example is not intended to limit the scope of the invention.

Those skilled in the art will appreciate that while the AD (258C) is shown as located on a right side of the MECC (210), the AD (258C) may be located on any other side of the MECC (210) without departing from the scope of the invention.

In one or more embodiments, as being separate components and as having separate ADs, once paired, the MITC (220) and the MECC (210) provide an additional security measure to the user access. For example, user 1 has access to the AD (258C) and user 2 has access to the ADs (258A-258C). In this case, because user 2 has access to all ADs, user 2 can access to the UCC (240), the MITC (220), and the MECC (210). However, because user 1 has access only to the AD (258C), user 1 cannot access to the UCC (240) and to the MITC (220).

The aforementioned example is not intended to limit the scope of the invention.

In one or more embodiments, similar to the MITC (220), the MECC (210) includes a connection interface, in which the connection interface is affixed to a pairing end of the MECC (210). The pairing end of the MECC (210) refers to a portion of the MECC (210) that can be paired with another component (e.g., the MITC (220)). In one or more embodiments, similar to the MITC (220), the connection interface of the MECC (210) includes MECCOMs (250A). The connection interface of the MECC (210) also includes the built-in airflow connection components.

In one or more embodiments, the MITC (220) and the MECC (210) are oriented in a same direction. Further, a double-headed arrow shows modularity of the system (e.g., 100, FIG. 1), in which the MECC (210) may be attached to, or detached from the MITC (220) along the same direction.

Those skilled in the art will appreciate that while the IHSs (230A, 230B) are oriented in parallel to the MECCOMs (250B), the IHSs (230A, 230B) may be oriented in any direction without departing from the scope of the invention.

In one or more embodiments, the MITC (220) includes one or more scaffolds (e.g., walls, structural skeletons, frameworks, etc.) (257A-257D), in which the scaffolds (257A-257D) may provide structural support to components of the MITC (220). For example, scaffolds (257B, 257C) provide structural support to a doorframe (not shown) of the AD (258A). As yet another example, scaffolds (257A, 257D) are a part of the pairing end of the MITC (220), in which the scaffolds (257A, 257D) may include at least a portion of the MECCOMs (250B).

In one or more embodiments, similar to the MITC (220), the MECC (210) includes one or more scaffolds (256A-256D), in which the scaffolds (256A-256D) may provide structural support to components of the MECC (210). For example, scaffolds (256C, 256D) provide structural support to a doorframe (not shown) of the AD (258C). As yet another example, scaffolds (256A, 256D) are a part of the pairing end of the MECC (210), in which the scaffolds (256A, 256D) may include at least a portion of the MECCOMs (250A).

The aforementioned examples are not intended to limit the scope of the invention.

In one or more embodiments, while the end-to-end pairing between the MITC (220) and the MECC (210) is being formed, the scaffolds (257A, 257D) needs to be connected to the scaffolds (256A, 256D), respectively, for compatible mechanical, electrical, and airflow connections. Additional details of the end-to-end pairing are described below in reference to FIGS. 3.1-5.2.

In one or more embodiments, "connected" may refer to "directly connected", in which there is a seal in between, for example, (i) the scaffold (256A) and the scaffold (257A), and (ii) the scaffold (256D) and the scaffold (257D).

Alternatively, "connected" may refer to "connected via one or more physical components in between". For example, the scaffold (256A) is connected to the scaffold (257A), in which at least one physical component is mechanically touching the scaffold (256A) and the scaffold (257A).

In one or more embodiments, the end-to-end and medium form factor (e.g., medium shape) of the modular data center (the system (e.g., 100, FIG. 1)) described in FIGS. 1 and 2.1 makes the system (e.g., 100, FIG. 1) deployable to, for example (but not limited to): space-unlimited locations, remote locations, etc. The space-unlimited locations may be, for example (but not limited to): university campuses, research and development locations, etc. The remote locations (e.g., edge locations) may be locations that are away from specialized IT and security personnel to maintain an operation of the modular data center.

Providing multiple functionalities and fitting these functionalities into the medium form factor make formation, deployment, and operation of the end-to-end modular data center easier for a customer that needs higher computing power. These functionalities also make possible to move from centralized cloud computing to decentralized edge computing. These functionalities may include, for example (but not limited to): a pre-integrated and ready-to-use IHS, an ability to plug into an existing security system, multiple ECC options, a high power resiliency, an optimized power distribution, higher power density within a data center, an easy service access, flexibility to support third-party components, a customer-specific component design, etc.

Further, a physical and functional split between the MECC (210) and the MITC (220) enables a variety of cooling technologies, capacities, and resiliencies to be paired with a variety of power capacities, resiliencies, and IHS technologies.

Turning now to FIG. 2.2, FIG. 2.2 shows a top view of a system in accordance with one or more embodiments of the invention. The system includes one or more MITCs (260A, 260B), one or more MECCs (264A-264C), and a modular UCC (MUCC) (266). The system may include additional, fewer, and/or different modular building blocks without departing from the scope of the invention. Each component illustrated in FIG. 2.2 is described below.

In comparison to the system (100) shown in FIG. 1, the system shown in FIG. 2.2 represents a large form factor modular data center that provides additional functionalities (e.g., scalability over time) with higher computing power and higher power density.

In an embodiment of the invention shown in FIG. 2.2, the MITC (260A) may be a mechanical structure that enables an IHS (265A) to be disposed within the MITC (260A). Similarly, the MITC (260B) may be a mechanical structure that enables one or more IHSs (265B, 265C) to be disposed within the MITC (260B).

In one or more embodiments, while disposing, the IHSs (265A-265C) may be affixed to floors (not shown) within the MITCs (260A, 260B) via the standard mechanical mechanisms. In one or more embodiments, the floors are affixed to bottom sides of the MITCs (260A, 260B). Other mechanical or non-mechanical mechanisms for affixing the IHSs (265A-265C) to the floors may be used without departing from the scope of the invention.

In one or more embodiments, white spaces within the MITCs (260A, 260B), where the IHSs (265A-265C) are located, may have a functionality to host different types of standard racks (e.g., 4×750 mm wide racks, 5×600 mm wide racks, etc.). The white spaces may also have a functionality to host custom designed racks. Both standard and custom designed racks may be pre-integrated into the floors before transportation to the customer site.

In one or more embodiments, apart from hosting the IHSs (265A-265C), the white spaces may also host other components, for example (but not limited to): immersion tanks, UPSs, battery racks, cable management towers, etc.

In one or more embodiments, the MITCs (260A, 260B) may be implemented as other types of structures adapted to host, position, orient, and/or otherwise physically, mechanically, electrically, and/or thermally manage the IHSs (265A-265C). In this manner, the MITCs (260A, 260B) may enable the IHSs (265A-265C) to be densely packed without negatively impacting the operation of the IHSs (265A-265C).

In one or more embodiments, as opposed to being integrated an inside of the MITC (260A) or an inside of the MITC (260B), the MUCC (266) is manufactured as a separate component. In this manner, the MUCC (266) may support one or more components at the same time. For example, the MUCC (266) may include a shared power supply component (not shown), in which the shared power supply component may have a functionality (e.g., a higher power capacity, a dynamic power distribution capability, etc.) to support the MITCs (260A, 260B) and MECCs (264A-264C) at the same time.

In one or more embodiments, MUCC (266) may be a standard MUCC. However, depending on how many components need to be supported, or, depending on a customer requirement, a size of the MUCC (266) may be expanded. For example, supporting four MITCs (rather than supporting two MITCs) needs a larger shared power supply component. For this reason, the size of the MUCC (266) needs to be expanded to host the larger shared power supply component.

The aforementioned examples are not intended to limit the scope of the invention.

In one or more embodiments, in addition to the MUCC (266), the system may provide one-to-one power architecture, in which each of the MITCs (260A, 260B) and/or the MECCs (264A-264C) may have a separate power supply component (e.g., a UPS, a battery, a transformer, etc.). For example, the MITC (260A) may need a larger current rating and a higher battery runtime to perform a complex task (e.g., a data migration from a distributed computing system). In this case, the power supply component of the MITC (260A) may provide an additional power to the MITC (260A).

The aforementioned examples are not intended to limit the scope of the invention.

In one or more embodiments, (i) the MITC (260A) includes ADs (261H, 261I), (ii) the MITC (260B) includes ADs (261A, 261B), and (iii) the MUCC (266) includes ADs (261E-261G). In one or more embodiments, the ADs (261A, 261B, and 261E-261I) may be walk-in doors or walk-up doors. For example, as a walk-in door, the AD (261I) may permit user access to an internal environment of the MITC (260A). As yet another example, as a walk-in door, the AD (261G) may permit user access to an internal environment of the MUCC (266).

The aforementioned examples are not intended to limit the scope of the invention.

Those skilled in the art will appreciate that while the ADs (261A, 261B, and 261E-261I) are shown as located on a particular side of the MITCs (260A, 260B) and the MUCC (266), the ADs (261A, 261B, and 261E-261I) may be located on any other side of the MITCs (260A, 260B) and the MUCC (266) without departing from the scope of the invention.

In one or more embodiments, the MITC (260A) includes a connection interface, in which the connection interface is affixed to a first pairing end of the MITC (260A). The first pairing end of the MITC (260A) refers to a portion of the MITC (260A) that can be paired in parallel with another component (e.g., the MUCC (266)). In one or more embodiments, the connection interface of the MITC (260A) includes MECCOMs (262A). The connection interface of the MITC (260A) also includes the built-in airflow connection components.

Further, the MITC (260A) includes an interposer (263B), in which the interposer (263B) is affixed to a second pairing end of the MITC (260A). The second pairing end of the MITC (260A) refers to a portion of the MITC (260A) that can be paired perpendicularly with another component (e.g., the MECC (264A)).

In one or more embodiments, the interposer (263B) includes electrical, mechanical, and airflow connection components (EMACCOMs). In one or more embodiments, the interposer (263B) may provide functionality to connect a standard or a third-party MECC to the MITC (260A).

In one or more embodiments, similar to the MITC (260A), the MITC (260B) includes a connection interface, in which the connection interface is affixed to a first pairing end of the MITC (260B). In one or more embodiments, the connection interface of the MITC (260B) includes MECCOMs (262D). The connection interface of the MITC (260B) also includes the built-in airflow connection components.

Further, similar to the MITC (260A), the MITC (260B) includes interposers (263D, 263F), in which the interposers (263D, 263F) are affixed to second and third pairing ends of the MITC (260B), respectively.

In one or more embodiments, the MUCC (266) includes one or more connection interfaces, in which each of the connection interfaces is affixed to one of the pairing ends of the MUCC (266). In one or more embodiments, a first connection interface of the MUCC (266) includes MECCOMs (262B). Similarly, a second connection interface of the MUCC (266) includes MECCOMs (262C). Both connection interfaces of the MUCC (266) also include the built-in airflow connection components.

In one or more embodiments, an area enclosed by the connection interface of the MITC (260A) is equal to an area enclosed by the first connection interface of the MUCC (266). In this manner, an end-to-end pairing between the MITC (260A) and the MUCC (266) may be installed for compatible mechanical, electrical, and airflow connections. Similarly, an area enclosed by the connection interface of the MITC (260B) is equal to an area enclosed by the second connection interface of the MUCC (266). In this manner, an end-to-end pairing between the MITC (260B) and the MUCC (266) may be installed for compatible mechanical, electrical, and airflow connections.

The MECC (264A) may include one or more physical devices that alter characteristics of an internal environment of the MITC (260A) and the MUCC (266) at a macroscopic level. The physical devices may also ensure reliability of the IHS (265A) and the MUCC (266). In one or more embodiments, the physical devices may be affixed to a floor of the MECC (264A).

In one or more embodiments, the MECC (264A) supplies cold air (shown with dashed line arrows) to the internal environment of the MITC (260A) (including the MUCC (266)) via the interposers (263A, 263B). The MECC (264A) also removes hot air (shown with solid line arrows) from the internal environment of the MITC (260A) (including the MUCC (266)) via the interposers (263A, 263B). In one or more embodiments, the dashed line and the solid line arrows inside of the MITC (260A) may be referred to as a cold aisle and a hot aisle, respectively. Details of the cold aisle and the hot aisle are described above in reference to FIG. 2.1.

In one or more embodiments, the interposer (263A) is affixed to a pairing end of the MECC (264A). In one or more embodiments, the MECC (264A) includes an AD (261J), in which the AD (261J) may be a walk-in door or a walk-up door. For example, as a walk-in door, the AD (261J) may permit user access to an internal environment of the MECC (264A).

The aforementioned example is not intended to limit the scope of the invention.

Those skilled in the art will appreciate that while the AD (261J) is shown as located on a rear side of the MECC (264A), the AD (261J) may be located on any other side of the MECC (264A) without departing from the scope of the invention.

In one or more embodiments, the interposer (263B) includes components that allow to connect to either standard or custom designed MECCs. In one or more embodiments, the interposers (263A, 263B) include airflow connection components that may twist a direction of an airflow formed between the MECC (264A) and the MITC (260A). For example, the interposers (263A, 263B) may include a bottom ducting component and an overhead ducting component. The bottom ducting component may supply cold air into the MITC (260A). The overhead ducting component may remove hot air from the MITC (260A) and may deliver the hot air to the MECC (264A).

In one or more embodiments, an area of the interposer (263A) is equal to an area of the interposer (263B). In this manner, an end-to-end pairing between the MITC (260A) and the MECC (264A) may be installed for compatible mechanical, electrical, and airflow connections.

In one or more embodiments, the MECC (264B) includes an interposer (263C), in which the interposer (263C) is affixed to a pairing end of the MECC (264B). Similarly, the MECC (264C) includes an interposer (263E), in which the interposer (263E) is affixed to a pairing end of the MECC (264C).

In one or more embodiments, the MECC (264B) also includes an AD (261C) and the MECC (264C) also includes an AD (261D). In one or more embodiments, the ADs (261C, 261D) may be walk-in doors or walk-up doors. For example, as a walk-in door, the AD (261C) may permit user access to an internal environment of the MECC (264B).

The aforementioned example is not intended to limit the scope of the invention.

Those skilled in the art will appreciate that while the AD (261C) is shown as located on a right side of the MECC (264B) and the AD (261D) is shown as located on a rear side of the MECC (264C), the ADs (261C, 261D) may be located on any other side of the MECCs (264B, 264C) without departing from the scope of the invention.

In one or more embodiments, an area of the interposer (263C) is equal to an area of the interposer (263D). Similarly, an area of the interposer (263E) is equal to an area of the interposer (263F). In this manner, an end-to-end pairing between the MITC (260B) and the MECCs (264B, 264C) may be installed for compatible mechanical, electrical, and airflow connections.

In one or more embodiments, similar to the MECC (264A), the MECCs (264B, 264C) may include one or more physical devices that alter characteristics of the internal environment of the MITC (260B) and the MUCC (266) at a macroscopic level. The physical devices may also ensure reliability of the IHSs (265B, 265C) and the MUCC (266). In one or more embodiments, the physical devices may be affixed to floors of the MECCs (264B, 264C).

In one or more embodiments, similar to the MECC (264A), the MECCs (264B, 264C) supply cold air (shown with dashed line arrows) to the internal environment of the MITC (260B) (including the MUCC (266)) via the interposers (263C-263F). The MECCs (264B, 264C) also remove hot air (shown with solid line arrows) from the internal environment of the MITC (260B) (including the MUCC (266)) via the interposers (263C-263F). In one or more embodiments, the dashed line and the solid line arrows inside of the MITC (260B) may be referred to as a cold aisle and a hot aisle, respectively.

In one or more embodiments, the interposers (263D, 263F) include components that allow to connect to either standard or custom designed MECCs. In one or more embodiments, the interposers (263C-263F) include airflow connection components that may twist a direction of an airflow formed between the MECCs (264B, 264C) and the MITC (260B). For example, the interposers (263C-263F) may include a bottom ducting component and an overhead ducting component. The bottom ducting component may supply cold air into the MITC (260B). The overhead ducting component may remove hot air from the MITC (260B) and may deliver the hot air to the MECCs (264B, 264C).

In one or more embodiments, depending on structural (e.g., a size), locational (e.g., being located in a harsh environment), and performance (e.g., an ability to perform complex tasks) characteristics of the MITCs (260A, 260B), the MITCs (260A, 260B) may be connected to additional MECCs.

In one or more embodiments, the MITCs (260A, 260B) and the MUCC (266) are oriented in a first direction, and the MECCs (264A-264C) are oriented in a second direction, in which the first direction and the second direction are perpendicular to each other. The MITCs (260A, 260B), the MUCC (266), and the MECCs (264A-264C) may be oriented differently with respect to each other without departing from the scope of the invention.

In one or more embodiments, perpendicularly oriented double-headed arrows show the modularity of the system, in which the MECCs (264A-264C) may be attached to, or detached from the MITCs (260A, 260B). Similarly, remaining double-headed arrows also show the modularity of the system, in which the MUCC (266) may be attached to, or detached from the MITCs (260A, 260B).

In one or more embodiments, rather than being perpendicularly oriented with the MITC (260A), the MECC (264A) may be placed (e.g., stacked) on top of the MITC (260A) (see FIG. 5.2). Similarly, rather than being perpendicularly oriented with the MITC (260B), the MECCs (264B, 264C) may be stacked on top of the MITC (260B). In this manner, the modularity of the system can be further improved.

Further, a physical and functional split between the MECCs (264A-264C), the MITCs (260A, 260B), and the MUCC (266) enables a variety of cooling technologies, capacities, and resiliencies to be paired with a variety of power capacities, resiliencies, MUCC, and IHS technologies.

Those skilled in the art will appreciate that while the IHSs (265A-265C) are shown as located on a particular side of the MITCs (260A, 260B), the IHSs (265A-265C) may be located on any other side of the MITCs (260A, 260B) without departing from the scope of the invention.

Those skilled in the art will appreciate that while the IHSs (265A-265C) are oriented in parallel to the MECCOMs (262A, 262D), the IHSs (265A-265C) may be oriented in any direction without departing from the scope of the invention.

In one or more embodiments, the MITC (260A) includes one or more scaffolds (267A, 267B), in which the scaffolds (267A, 267B) may provide structural support to components of the MITC (260A). For example, the scaffolds (267A, 267B) are a part of the first pairing end of the MITC (260A), in which the scaffolds (267A, 267B) may include at least a portion of the MECCOMs (262A). As yet another example, the scaffold (267A) is a part of the second pairing end of the MITC (260A), in which the scaffold (267A) may include at least a portion of the EMACCOMs of the interposer (263B).

In one or more embodiments, similar to the MITC (260A), the MITC (260B) includes one or more scaffolds (269A, 269B), in which the scaffolds (269A, 269B) may provide structural support to components of the MITC (260B). For example, the scaffolds (269A, 269B) are a part of the first pairing end of the MITC (260B), in which the scaffolds (269A, 269B) may include at least a portion of the MECCOMs (262D). As yet another example, the scaffold (269A) is a part of the second and third pairing ends of the MITC (260B), in which the scaffold (269A) may include at least a portion of the EMACCOMs of the interposers (263D, 263F).

The aforementioned examples are not intended to limit the scope of the invention.

In one or more embodiments, for example, while the end-to-end pairing between the MITC (260A) and the MECC (264A) is being formed, the scaffold (267A) needs to be connected to one or more scaffolds (not shown) of the MECC (264A) for compatible mechanical, electrical, and airflow connections.

In one or more embodiments, similar to the MITC (260A), the MUCC (266) and the MECCs (264A-264C) include one or more scaffolds (e.g., 268A, 270A, and, 271A, etc.). The scaffolds (e.g., 268A, 270A, and, 271A, etc.) may have the same functionalities (discussed above) as the scaffolds (267A, 267B) of the MITC (260A).

In one or more embodiments, the end-to-end and large form factor of the modular data center (the system) described in FIG. 2.2 makes the system suitable for larger workloads (e.g., parallel processing computation in a distributed computing system) and deployable to, for example (but not limited to): space-unlimited locations, remote locations, etc.

Providing multiple functionalities and fitting these functionalities into the large form factor make formation, deployment, and operation of the end-to-end modular data center easier for a customer that needs higher computing power, higher power density, and scalability. These functionalities also make possible to move from centralized cloud computing to decentralized edge computing and to add or remove components from the large form factor modular data center over time. These functionalities may include, for example (but not limited to): a pre-integrated and ready-to-use IHS, an ability to plug into an existing security system, multiple ECC options, a high ECC resiliency, an optimized power distribution, higher power density within a data center, an easy service access, flexibility to support third-party components, customer-specific component design, scalability over time, etc.

Turning now to FIG. 2.3, FIG. 2.3 shows a diagram of the IHS (230A) in accordance with one or more embodiments of the invention. The IHS (230A) may include a rack (280) and any number of computing devices (e.g., 290).

In one or more embodiments, the rack (280) may be a mechanical structure that enables the computing devices to be positioned with respect to one another. For example, the rack (280) may be a mountable enclosure that enables the computing devices to be disposed within the rack (280). The rack (280) may be implemented as other types of structures adapted to host, position, orient, and/or otherwise physically, mechanically, electrically, and/or thermally manage the computing devices. By managing the computing devices, the rack (280) may enable the computing devices to be densely packed in a space without negatively impacting the operation of the IHS (230A).

In one or more embodiments, a computing device (e.g., 290) may be a mechanical structure for housing components of the IHS (230A). For example, the computing device (e.g., 290) may be implemented as a rack-mountable enclosure for housing components of the IHS (230A). The computing device (e.g., 290) may be adapted to be disposed within the rack (280) and/or utilize services provided by the rack (280) and/or other components available in the system (e.g., 100, FIG. 1).

In one or more embodiments, a computing device positioned into a pre-integrated rack may be ready-to-use (e.g., pre-configured with software, hardware, etc.) when deployed to the customer site. However, the customer may alter a configuration of the pre-configured computing device after the deployment. For example, the customer may increase memory capacity of the computing device after the deployment. As yet another example, the customer may increase processor capacity of the computing device after the deployment.

The aforementioned examples are not intended to limit the scope of the invention.

In one or more embodiments, one or more isolators may be attached to the components (e.g., the IHSs (e.g., 230A, 230B, FIG. 2.1)) of the system (e.g., 100, FIG. 1) to make sure that the components are ready-to-use when they deployed to the customer site. In one or more embodiments, the isolators provide a shock isolation to the components such that the components may be protected from any damage (e.g., a vibrational damage).

Turning now to FIG. 2.4, FIG. 2.4 shows a diagram of the computing device (290) in accordance with one or more embodiments of the invention. In one or more embodiments, the computing device (290) includes six sides (i.e., top, bottom, right, left, front, and rear), in which air drawn into from a front side of the computing device (e.g., via an air inlet (292)) and expelled from the rear side of the computing device (e.g., via one or more ECCs). An airflow direction is shown with a dashed line arrow (cold air) and a solid line arrow (hot air). In general, air incoming from the front side of the computing device (290) is cooler than air outgoing from the rear side of the computing device (290).

In one or more embodiments, to provide services, the computing device (290) may utilize resources provided by a number of hardware components hosted within the computing device (290). The hardware components may be, for example (but not limited to): processors, non-persistent storage devices, printed circuited boards, persistent storage devices, peripheral components interconnects, special purpose hardware components, etc. In one or more embodiments, some of the hardware components may be omitted or additional hardware components may be added based on the services provided by the computing device (290).

The aforementioned example is not intended to limit the scope of the invention.

As used herein, "computing" refers to any operations that may be performed by a computer, including (but not limited to): computation, data storage, data retrieval, communications, etc.

As used herein, a "computing device" includes any of various devices in which a computing operation may be carried out. A computing device may be, for example (but not limited to): a compute IHS component, a storage IHS component, a network device, a telecommunications component, etc.

The aforementioned examples are not intended to limit the scope of the invention.

In one or more embodiments, the medium form factor of the system described in FIG. 2.1 and the large form factor of the system described in FIG. 2.2 may increase a PUE value of the computing device (290). For example, because the system described in FIG. 2.1 includes a separate cooling and/or heating unit (210), the computing device (290) may not have a fan and/or a heating component. In this manner, the computing device (290) may become more power dense and power-efficient.

FIGS. 3.1-3.6 show a pairing process of a portion of the connection interface of the MITC (e.g., 220, FIG. 2.1) and a portion of the connection interface of the MECC (e.g., 210, FIG. 2.1) in accordance with one or more embodiments of the invention.

Turning now to FIG. 3.1, FIG. 3.1 shows an initial stage of the pairing process in accordance with one or more embodiments of the invention. In an embodiment of the invention shown in FIG. 3.1, the embodiment includes a first scaffold (325) and a second scaffold (326). The first scaffold (325) may be the same as the scaffold (257A) as discussed above in reference to FIG. 2.1. Similarly, the second scaffold (326) may be the same as the scaffold (256A) as discussed above in reference to FIG. 2.1.

In one or more embodiments, a connection interface of the first scaffold (325) may include a first set of mechanical connection components. The first set of mechanical connection components may include, for example (but not limited to): one or more mounting components (MCs) (310A-310C), one or more studs (340A, 340B), a first gasket (e.g., a first continuity gasket, a first gasket seal, etc.) (315), and a first sealing adhesive component (300), etc. In one or more embodiments, the MCs (310A-310C) may include one or more studs (320A-320C) to be used for aligning the first scaffold (325) and the second scaffold (326) along a same direction (shown with dashed lines).

The aforementioned example is not intended to limit the scope of the invention.

In one or more embodiments, a connection interface of the second scaffold (326) may include a second set of mechanical connection components. The second set of mechanical connection components may include, for example (but not limited to): one or more mounting components (MCs) (310D-310F), one or more studs (340C, 340D), a second gasket (not shown), and a second sealing adhesive component (not shown), etc.

In one or more embodiments, the MCs (310D-310F) may include one or more nuts (330A-330C) to be used for aligning the first scaffold (325) and the second scaffold (326) along the same direction. In one or more embodiments, an area enclosed by the connection interface of the first scaffold (325) is equal to an area enclosed by the connection interface of the second scaffold (326).

The aforementioned example is not intended to limit the scope of the invention.

In one or more embodiments, to align the first scaffold (325) and the second scaffold (326) along the same direction, the nuts (330A-330C) are affixed to the studs (320A-320C).

In one or more embodiments, when the connection interface of the first scaffold (325) is connected to the connection interface of the second scaffold (326) (see FIG. 3.2), the MCs (310A-310C) and the MCs (310D-310F) may keep the first scaffold (325) connected to the second scaffold (326) and/or may provide structural support to the first scaffold (325) and to the second scaffold (326).

Those skilled in the art will appreciate that while the studs (320A-320C, 340A, and 340B) and the nuts (330A-330C) are used as mechanical connection components, any other mechanical or non-mechanical components may be used as mechanical connection components without departing from the scope of the invention.

In one or more embodiments, the MCs (310A-310C) and the studs (320A-320C, 340A, and 340B) are located on an outside surface of the first scaffold (325). Said another way, the MCs (310A-310C) and the studs (320A-320C, 340A, and 340B) are located on the outside of the MITC (e.g., 220, FIG. 2.1) (shown with a left brace).

In one or more embodiments, the MCs (310D-310F), the studs (340C, 340D), and the nuts (330A-330C) are located on an outside surface of the second scaffold (326). Said another way, the MCs (310D-310F), the studs (340C, 340D), and the nuts (330A-330C) are located on the outside of the MECC (e.g., 210, FIG. 2.1) (shown with the left brace).

Those skilled in the art will appreciate that while the MCs (310A-310C) and the studs (320A-320C, 340A, and 340B) are shown as located on the outside of the MITC (e.g., 220, FIG. 2.1), the MCs (310A-310C) and the studs (320A-320C, 340A, and 340B) may be located on inside of the MITC (e.g., 220, FIG. 2.1) without departing from the scope of the invention.

Those skilled in the art will appreciate that while the MCs (310D-310F), the studs (340C, 340D), and the nuts (330A-330C) are shown as located on the outside of the MECC (e.g., 210, FIG. 2.1), the MCs (310D-310F), the studs (340C, 340D), and the nuts (330A-330C) may be located on inside of the MECC (e.g., 210, FIG. 2.1) without departing from the scope of the invention.

In one or more embodiments, when the connection interface of the first scaffold (325) is connected to the connection interface of the second scaffold (326), the first sealing adhesive component (300) and the second sealing adhesive component provide a weather-proofed protection (e.g., protection from rain) to at least a portion of the system (e.g., 100, FIG. 1). To further improve the weather-proofed protection, at least the portion of the system (e.g., 100, FIG. 1) may be sealed with, for example, silicone sealant and/or latex caulk. In one or more embodiments, a sealing adhesive component may be, for example (but not limited to): a very high bonding (VHB) tape, a butyl tape, etc.

The aforementioned example is not intended to limit the scope of the invention.

In one or more embodiments, the first set of mechanical connection components may further include a first set of mechanical hard-stop components (not shown). Similarly, the second set of mechanical connection components may further include a second set of mechanical hard-stop components (not shown). Additional details of the mechanical hard-stop components are described below in reference to FIGS. 5.1 and 5.2.

In one or more embodiments, when the connection interface of the first scaffold (325) is connected (horizontally) to the connection interface of the second scaffold (326), the first set of mechanical hard-stop components and the second set of mechanical hard-stop components permit uniform compression of the first gasket (315) and the second gasket. In one or more embodiments, the uniform compression of the first gasket (315) and the second gasket closes any gaps, for example, resulting from mechanical tolerances when the connection interfaces are met. In this manner, the uniform compression provides a steady environment for an internal environment of at least the portion of the system (e.g., 100, FIG. 1).

In one or more embodiments, the first gasket (315) and the second gasket may be, for example (but not limited to): a foam gasket, a rubber gasket, etc.

The aforementioned example is not intended to limit the scope of the invention.

In one or more embodiments, while the mechanical connection components discussed in FIGS. 3.1-3.6 are for the scaffolds (325, 326), remaining scaffolds in the system (e.g., 100, FIG. 1) may also include the same mechanical connection components. In one or more embodiments, the remaining scaffolds may be, for example (but not limited to): scaffold (e.g., 256D, FIG. 2.1), scaffold (e.g., 257D, FIG. 2.1), a ceiling scaffold, a floor scaffold, etc.

Turning now to FIG. 3.2, FIG. 3.2 shows an intermediate stage of the pairing process in accordance with one or more embodiments of the invention. In an embodiment of the invention shown in FIG. 3.2, with the help of MCs (310A-310F), the connection interface of the first scaffold (325) is connected to the connection interface of the second scaffold (326).

In one or more embodiments, when the connection interface of the first scaffold (325) is connected to the connection interface of the second scaffold (326), a scaffold interface (e.g., a seam) (309) is generated. More specifically, when the first scaffold (325) is pushed toward to the second scaffold (326), the first gasket (315) and the second gasket are crushed, and the scaffold interface (309) is generated. In one or more embodiments, an electromagnetic interface (EMI) shielding component (350A) is attached to spacing between the stud (340A) and the stud (340D). Similarly, another EMI shielding component (350B) is attached to spacing between the stud (340B) and the stud (340C). In one or more embodiments, an EMI shielding component may be, for example (but not limited to): a copper sheet metal, a copper-added galvanized iron sheet metal, an EMI tape, etc.

The aforementioned example is not intended to limit the scope of the invention.

In one or more embodiments, the EMI shielding components (350A, 350B) overlap at least a portion of the scaffold interface (309). In this manner, the EMI shielding components (350A, 350B) protect at least a portion of the system (e.g., 100, FIG. 1) from external EM radiation.

In an embodiment of the invention shown in FIG. 3.2, a steel plate (360A) is aligned with spacing between the MCs (310A, 310F) and the MCs (310B, 310E). The steel plate (360A) may include one or more nuts (330D, 330E) to be affixed to the studs (340A, 340D). For this reason, the nuts (330D, 330E) are aligned (shown with dashed lines) along a direction of the studs (340A, 340D).

Further, another steel plate (360B) is aligned with spacing between the MCs (310B, 310E) and the MCs (310C, 310D). The steel plate (360B) may include one or more nuts (330F, 330G) to be affixed to the studs (340B, 340C). For this reason, the nuts (330F, 330G) are aligned (shown with dashed lines) along a direction of the studs (340B, 340C).

Turning now to FIG. 3.3, FIG. 3.3 shows an intermediate stage of the pairing process in accordance with one or more embodiments of the invention. In an embodiment of the invention shown in FIG. 3.3, the steel plate (360A) is affixed to the spacing between the MCs (310A, 310F) and the MCs (310B, 310E), in which the steel plate (360A) provides an extra layer of structural support to the first scaffold (325) and to the second scaffold (326) to keep the scaffolds (325, 326) together. The steel plate (360A) also provides structural support to the EMI shielding component (e.g., 350A, FIG. 3.2).

Similarly, the steel plate (360B) is affixed to the spacing between the MCs (310B, 310E) and the MCs (310C, 310D), in which the steel plate (360B) provides an extra layer of structural support to the first scaffold (325) and to the second scaffold (326). The steel plate (360B) further provides structural support to the EMI shielding component (e.g., 350B, FIG. 3.2).

Turning now to FIG. 3.4, FIG. 3.4 shows an intermediate stage of the pairing process in accordance with one or more embodiments of the invention. In an embodiment of the invention shown in FIG. 3.4, the MCs (310A-310C) are removed (e.g., detached, disengaged, etc.) from the first scaffold (325). Similarly, the MCs (310D-310F) are removed from the second scaffold (326).

Similar to FIG. 3.2, one or more EMI shielding components (350C-350E) are then attached to spacing between one or more studs (340E-340J) that were underneath now removed MCs (310A-310F). For example, the EMI shielding component (350C) is attached to spacing between the stud (340E) and the stud (340J). As yet another example, the EMI shielding component (350D) is attached to spacing between the stud (340F) and the stud (340I). Further, the EMI shielding component (350E) is attached to spacing between the stud (340G) and the stud (340H). Details of the EMI shielding component are described above in reference to FIG. 3.2.

The aforementioned examples are not intended to limit the scope of the invention.

In one or more embodiments, the EMI shielding components (350C-350E) overlap at least a portion of the scaffold interface (309). In this manner, the EMI shielding components (350C-350E) protect at least a portion of the system (e.g., 100, FIG. 1).

Turning now to FIG. 3.5, FIG. 3.5 shows an intermediate stage of the pairing process in accordance with one or more embodiments of the invention. In an embodiment of the invention shown in FIG. 3.5, similar to FIG. 3.2, a steel plate (360C) is aligned with spacing where the MCs (310A, 310F) were located. The steel plate (360C) may include one or more nuts (330H, 330I) to be affixed to the studs (340E, 340J). For this reason, the nuts (330H, 330I) are aligned (shown with dashed lines) along a direction of the studs (340E, 340J).

Further, another steel plate (360D) is aligned with spacing where the MCs (310B, 310E) were located. The steel plate (360D) may include one or more nuts (330J, 330K) to be affixed to the studs (340F, 340I). For this reason, the nuts (330J, 330K) are aligned (shown with dashed lines) along a direction of the studs (340F, 340I).

Similar to the steel plate (360D), a steel plate (360E) is aligned with spacing where the MCs (310C, 310D) were located. The steel plate (360E) may include one or more nuts (330L, 330M) to be affixed to the studs (340G, 340H). For this reason, the nuts (330L, 330M) are aligned (shown with dashed lines) along a direction of the studs (340G, 340H).

Turning now to FIG. 3.6, FIG. 3.6 shows a final stage of the pairing process in accordance with one or more embodiments of the invention. In an embodiment of the invention shown in FIG. 3.6, similar to FIG. 3.3, the steel plate (360C) is affixed to the spacing where the MCs (310A, 310F) were located, in which the steel plate (360C) provides an extra layer of structural support to the first scaffold (325) and to the second scaffold (326). The steel plate (360C) further provides structural support to the EMI shielding component (e.g., 350C, FIG. 3.5).

Similarly, the steel plate (360D) is affixed to the spacing where the MCs (310B, 310E) were located, in which the steel plate (360D) provides an extra layer of structural support to the first scaffold (325) and to the second scaffold (326). The steel plate (360D) further provides structural support to the EMI shielding component (e.g., 350D, FIG. 3.5).

Further, the steel plate (360E) is affixed to the spacing where the MCs (310C, 310D) were located, in which the steel plate (360E) provides an extra layer of structural support to the first scaffold (325) and to the second scaffold (326). The steel plate (360E) further provides structural support to the EMI shielding component (e.g., 350E, FIG. 3.5).

At the end of the final stage of the pairing process, the first scaffold (325) and the second scaffold (326) are mechanically connected (e.g., paired).

Figure 4:
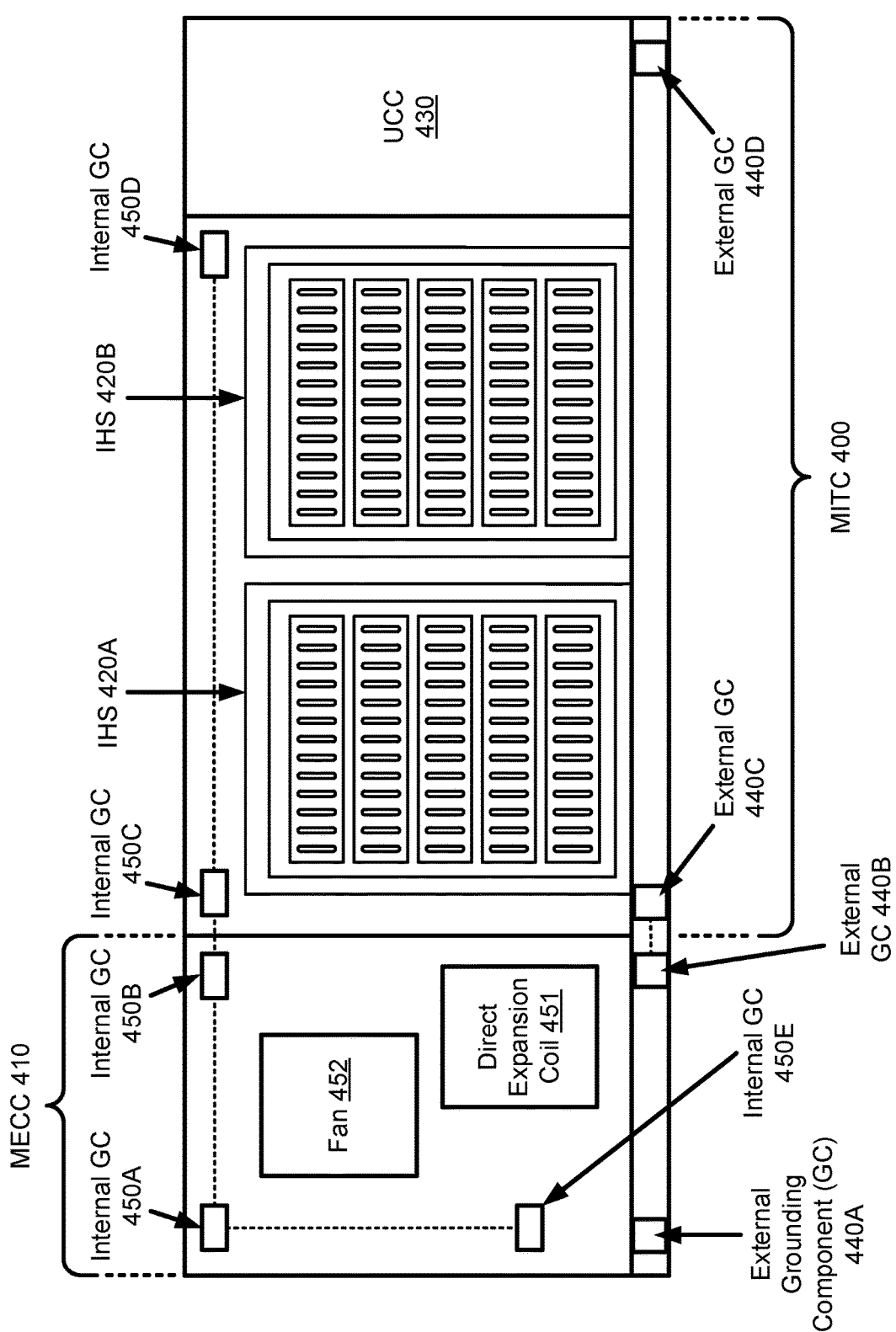
FIG. 4 shows a side view of the system of FIG. 2.1 in accordance with one or more embodiments of the invention.

Turning now to FIG. 4, FIG. 4 shows a side view of the system of FIG. 2.1 in accordance with one or more embodiments of the invention. In an embodiment of the invention shown in FIG. 4, the MITC (400) and the MECC (410) are mechanically connected, in which the MITC (400) and the MECC (410) may be sensitive compartmented information facilities (SCIFs) or non-SCIFs. To install electrical connections between components of the MITC (400) and the MECC (410), the MITC (400) and the MECC (410) include one or more internal grounding components (GC) (450A-450E) that are located at various locations within the MITC (400) and the MECC (410). The various locations may be, for example (but not limited to): inside of a panel of a UCC, inside of a white space of an MITC, a floor of a MECC, a ceiling of an MITC, etc.

The aforementioned example is not intended to limit the scope of the invention.

In one or more embodiments, the internal GCs (450C, 450D) within the MITC (400) are connected to each other (shown with a dashed line) to generate a common grounding point (e.g., a common reference) and to provide extra electrical protection. Similarly, the internal GCs (450A, 450B, and 450E) within the MECC (410) are connected to each other (shown with dashed lines) to generate a second common reference. The second common reference is then connected to the common reference (shown with a dashed line between the MECC (410) and the MITC (400)) to generate proper internal grounding. In this manner, ground loops within the system (e.g., 100, FIG. 1) may be avoided.

In one or more embodiments, the dashed lines connecting the internal GCs (450A-450E) represent electrical ground cables (e.g., copper grounding cables). Further, the internal GCs (450A-450E) represent electrical ground bars (e.g., panel ground bus bars), in which the electrical ground cables (e.g., internal grounding cables) are affixed to the electrical ground bars. In one or more embodiments, the electrical ground bars may be made of, for example (but not limited to): copper, galvanized steel, etc.

As used herein, a "cable" includes any cable, conduit, or line that carries one or more conductors and that is flexible over at least a portion of its length. A cable may include a connector portion, such as a plug, at one or more of its ends.

The electrical ground cables are affixed to the electrical ground bars via ground lugs (e.g., two hole ground lugs). In one or more embodiments, a ground lug may refer to a lug that connects a grounding conductor (e.g., an electrical ground cable) to a grounding electrode (e.g., an electrical ground bar).

In one or more embodiments, the internal GCs (450A-450E) are connected to one or more external GCs (440A-440D), in which the external GCs (440A-440D) are connected to earth ground (e.g., a facility ground). In this manner, the internal GCs (450A-450E) are physically connected to the earth ground to neutralize any excess surge from the internal GCs (450A-450E).

In one or more embodiments, an external GC (e.g., 440A, 440D, etc.) may be located at an end of a component (e.g., MITC (400), MECC (410), etc.). An external GC (e.g., 440A, 440D, etc.) may also be located close to where two components (e.g., MITC (400), MECC (410), etc.) are connected.

Those skilled in the art will appreciate that while the external GCs (440A-440D) are shown as located on a particular side of the MITC (400) and the MECC (410), the external GCs (440A-440D) may be located on any other side of the MITC (400) and the MECC (410) without departing from the scope of the invention.

In one or more embodiments, the external GCs (440A, 440D) are connected to the facility ground (via electrical ground cables). The external GCs (440A, 440D) are also connected to the external GCs (440B, 440C) to provide the facility ground to the external GCs (440B, 440C). Further, to generate proper external grounding and to avoid ground loops within the system (e.g., 100, FIG. 1), the external GC (440B) is connected to the external GC (440C) (shown with a dashed line).

In one or more embodiments, the dashed line connecting the external GC (440B) to the external GC (440C) represents an electrical ground cable. Further, the external GCs (440A-440D) represent electrical ground plates (e.g., stainless steel plates, galvanized steel plates, etc.), in which electrical ground cables (e.g., external grounding cables, facility ground cables, etc.) are affixed to the electrical ground plates. The electrical ground cables are affixed to the electrical ground plates via ground lugs.

In one or more embodiments, to transmit or to receive power and data (e.g., temperature data, humidity data, etc.) between components of the MITC (400) and the MECC (410), the MITC (400) and the MECC (410) include one or more electrical connection components (not shown). The electrical connection components may be located at various locations within the MITC (400) and the MECC (410). The various locations may be, for example (but not limited to): inside of a panel of a UCC, a ceiling of an MITC, a floor of a MECC, etc.

The aforementioned examples is not intended to limit the scope of the invention.

In one or more embodiments, for example, the UCC (430) may collect a temperature of one or more components within the MITC (400) as temperature data. Based on the collected data, the UCC (430) may activate or deactivate the MECC (410) using the electrical connection components.

The aforementioned example is not intended to limit the scope of the invention.

In one or more embodiments, the electrical connection components can be quickly installed (e.g., a plug-and-play architecture) within the system (e.g., 100, FIG. 1) without requiring any specialized person (e.g., an electrician). The plug-and-play architecture provides easy connection and disconnection capabilities for, for example, field testing and maintenance of the electrical connection components.

In one or more embodiments, the electrical connection components may have a blind-mate connection capability, in which an electrical connection component may be paired with another electrical connection component without aligning the two components in a particular way (e.g., by sliding, by snapping, etc.). The electrical connection components may have other capabilities without departing from the scope of the invention.

Turning now to FIG. 5.1, FIG. 5.1 shows a connection interface of an MITC (500) in accordance with one or more embodiments of the invention. The MITC (500) may be the same as the MITC (220) as discussed above in reference to FIG. 2.1. The MITC (500) includes a set of mechanical hard-stop components (510A-510D) and a gasket (520). The gasket (520) may be the same as the gasket (315) as discussed above in reference to FIG. 3.1.

In one or more embodiments, for example, when a connection interface of the MITC (500) is connected (horizontally) to a connection interface of a MECC (e.g., 210, FIG. 2.1), the set of mechanical hard-stop components (510A-510D) and a set of mechanical hard-stop components of the MECC (e.g., 210, FIG. 2.1) permit uniform compression of the gasket (520) and a gasket of the MECC (e.g., 210, FIG. 2.1).

In one or more embodiments, the uniform compression of the gasket (520) and the gasket of the MECC (e.g., 210, FIG. 2.1) closes any gaps that exist between the connection interfaces. In this manner, the uniform compression of the gasket (520) and the gasket of the MECC (e.g., 210, FIG. 2.1) provides a steady environment for an internal environment of the system (e.g., 100, FIG. 1).

Continuing with the example discussed above, the set of mechanical hard-stop components (510A-510D) and the set of mechanical hard-stop components of the MECC (e.g., 210, FIG. 2.1) keep the MECC (e.g., 210, FIG. 2.1) connected to the MITC (500). The set of mechanical hard-stop components (510A-510D) and the set of mechanical hard-stop components of the MECC (e.g., 210, FIG. 2.1) also provide structural support to the MECC (e.g., 210, FIG. 2.1) and to the MITC (500) in case of a seismic event.

In one or more embodiments, a hard-stop component may be, for example (but not limited to): a steel bar, a steel plate, a rigid sealing component, etc.

Those skilled in the art will appreciate that while the set of mechanical hard-stop components (510A-510D) are shown as located on a particular side of the connection interface of the MITC (500), the set of mechanical hard-stop components (510A-510D) may be located on any other side of the connection interface of the MITC (500) without departing from the scope of the invention.

In one or more embodiments, for further protection from the seismic events, the MITC (500) and the MECC (e.g., 210, FIG. 2.1) may include additional mechanical connection components (e.g., additional constraints). The additional mechanical connection components may be, for example (but not limited to): steel plates with bolted connections, additional mechanical hard-stop components, etc. In one or more embodiments, the additional mechanical connection components may be located inside of or outside of the MITC (500) and the MECC (e.g., 210, FIG. 2.1).

Turning now to FIG. 5.2, FIG. 5.2 shows a diagram of a MECC (540) that is stacked on top of an MITC (502) in accordance with one or more embodiments of the invention. In one or more embodiments, rather than being oriented in a same plane (e.g., perpendicularly (see FIG. 2.2), in parallel (see FIG. 2.1), etc.) as the MITC (502), the MECC (540) may be oriented in a vertically different plane. In this manner, a modularity of a system (504) can be further improved.

In one or more embodiments, similar to FIG. 5.1, the MITC (502) includes a first set of mechanical hard-stop components (530A-530D) and a first gasket (535), and the MECC (540) includes a second set of mechanical hard-stop components (not shown) and a second gasket (not shown). When a connection interface of the MITC (502) is connected (vertically) to a connection interface of the MECC (540), the first set of mechanical hard-stop components (530A-530D) and the second set of mechanical hard-stop components permit uniform compression of the first gasket (535) and the second gasket.

In one or more embodiments, the uniform compression of the first gasket (535) and the second gasket closes any gaps that exist between the connection interfaces. In this manner, the uniform compression of the first gasket (535) and the second gasket provides a steady environment for an internal environment of the system (504).

Similar to FIG. 5.1, the first set of mechanical hard-stop components (530A-530D) and the second set of mechanical hard-stop components keep the MECC (540) connected to the MITC (502). The first set of mechanical hard-stop components (530A-530D) and the second set of mechanical hard-stop components also provide structural support to the MECC (540) and to the MITC (502) in case of the seismic event.

Those skilled in the art will appreciate that while the first set of mechanical hard-stop components (530A-530D) are shown as located on a particular side of the connection interface of the MITC (502), the first set of mechanical hard-stop components (530A-530D) may be located on any other side of the connection interface of the MITC (502) without departing from the scope of the invention.

Similar to FIG. 5.1, for further protection from the seismic events, the MITC (502) and the MECC (540) may include the additional mechanical connection components. In one or more embodiments, the additional mechanical connection components may be located inside of or outside of the MITC (502) and the MECC (540).

In one or more embodiments, a double-headed arrow shows the modularity of the system (504), in which the MECC (540) may be attached to, or detached from the MITC (502).

Figure 6:
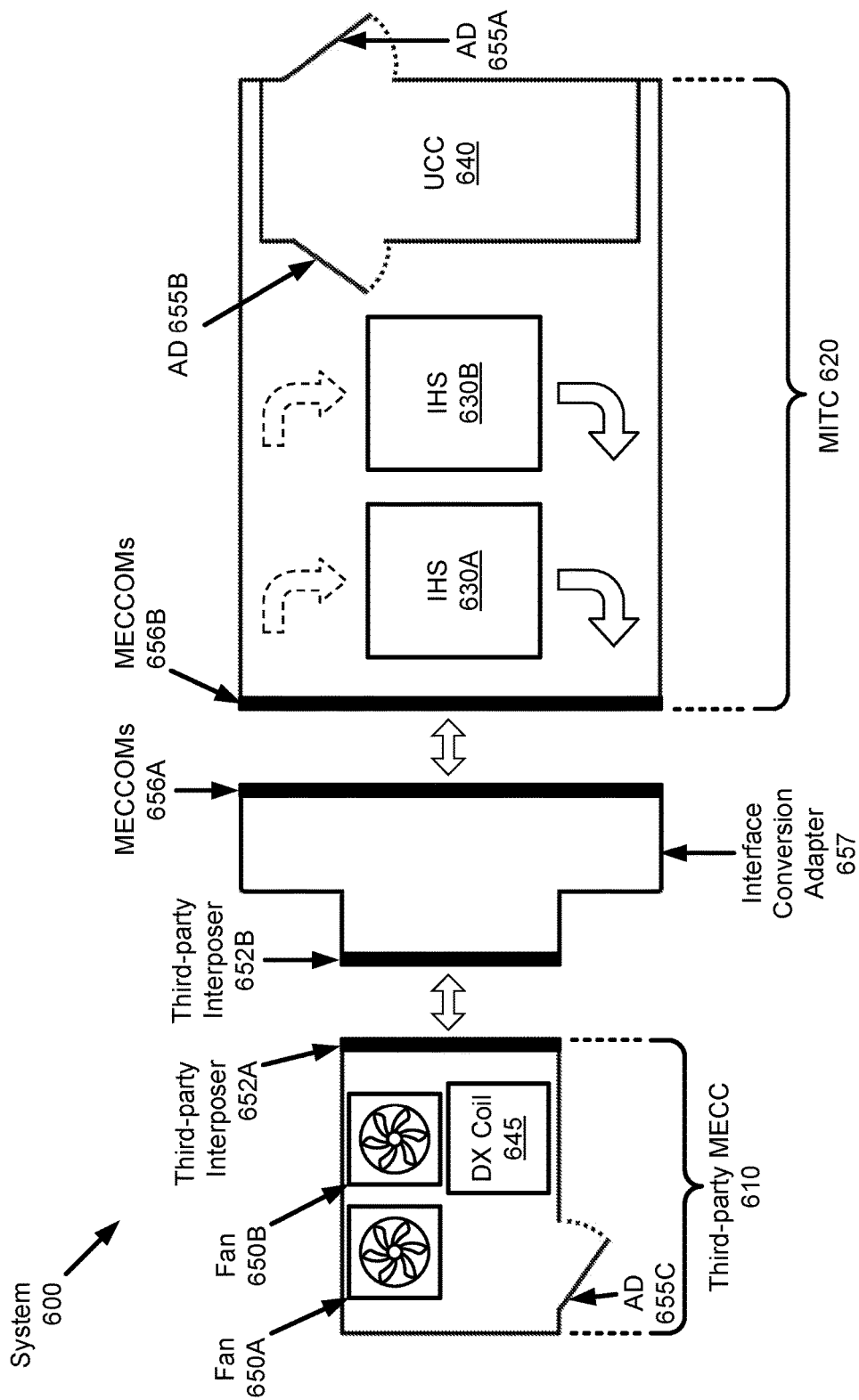
FIG. 6 shows a top view of a system in accordance with one or more embodiments of the invention.

Turning now to FIG. 6, FIG. 6 shows a top view of a system (600) in accordance with one or more embodiments of the invention. Referring to the system described in FIG. 2.1, the MECC (e.g., 210, FIG. 2.1) is replaced with a third-party MECC (610) and an interface conversion adapter (ICA) (657) is added to the system (600).

In one or more embodiments, an MITC (620) may be a mechanical structure that enables one or more IHSs (630A, 630B) and a UCC (640) to be disposed within the MITC (620). While disposing, the IHSs (630A, 630B) may be affixed to a floor (not shown) within the MITC (620) via the standard mechanical mechanisms. Other mechanical or non-mechanical mechanisms for affixing the IHSs (630A, 630B) to the floor may be used without departing from the scope of the invention. Further, the MITC (620) may be implemented as other types of structures adapted to host, position, orient, and/or otherwise physically, mechanically, electrically, and/or thermally manage the IHSs (630A, 630B) and the UCC (640).

In one or more embodiments, a white space within the MITC (620) may have a functionality to host different types of standard racks and to host custom designed racks. Further, the MITC (620) includes an AD (655A) and, similarly, the UCC (640) includes an AD (655B). Details of the UCC, the white space, the ADs, and the IHSs are described above in reference to FIGS. 2.1, 2.3, and 2.4, respectively.

In one or more embodiments, the MITC (620) may include a connection interface, in which the connection interface is affixed to a pairing end of the MITC (620). The pairing end of the MITC (620) refers to a portion of the MITC (620) that can be paired with another component (e.g., the ICA (657)). In one or more embodiments, the connection interface of the MITC (620) includes MEC-COMs (656B). The connection interface of the MITC (620) also includes the built-in airflow connection components. Details of the MECCOMs are described above in reference to FIGS. 3.1-5.2.

In one or more embodiments, an area enclosed by the connection interface of the MITC (620) is equal to an area enclosed by a connection interface of the ICA (657) (discussed below). In this manner, an end-to-end pairing between the MITC (620) and the ICA (657) may be installed for compatible mechanical, electrical, and airflow connections.

In one or more embodiments, similar to the MECC (e.g., 210, FIG. 2.1), the third-party MECC (610) may include one or more physical devices that alter characteristics of an internal environment of the MITC (620) at a macroscopic level. The physical devices may also ensure reliability of the IHSs (630A, 630B) and the UCC (640). In one or more embodiments, a physical device may be, for example (but not limited to): a fan (650A, 650B), a DX coil (645), a fluid mixture unit, a heater component, an immersion cooling component, etc. Details of the physical devices are described above in reference to FIG. 2.1.

The aforementioned example is not intended to limit the scope of the invention.

Similar to the MECC (e.g., 210, FIG. 2.1), the third-party MECC (620) may provide "N+1" or "N+2" heating and/or cooling resiliency. Further, the third-party MECC (620) includes an AD (655C). However, some structural characteristics of the third-party MECC (610) may be different from the structural characteristics of a standard MECC (e.g., 210, FIG. 2.1). A different structural characteristic may be, for example (but not limited to): a different size, a different mechanical connection component, a different number of ECCs, a different airflow path, a different number sensors outputs, a different electrical connection component, etc.

For example, positions of cold air ducting and hot air ducting within the third-party MECC (610) may be different than positions of cold air ducting and hot air ducting within the standard MECC (e.g., 210, FIG. 2.1). As yet another example, a position of an internal GC within the third-party MECC (610) may be different than a position of an internal GC within the standard MECC (e.g., 210, FIG. 2.1).

The aforementioned examples are not intended to limit the scope of the invention.

In one or more embodiments, with the help of the ICA (657), the different structural characteristics of the third-party MECC (610) can be adapted and the third-party MECC (610) can be paired with the MITC (620). In this manner, a customer may have a flexibility of pairing the MITC (620) (i) with the standard MECC (e.g., 210, FIG. 2.1) without using the ICA (657), or (ii) with the third-party MECC (620) using the ICA (657).

In one or more embodiments, similar to the MECC (e.g., 264A, FIG. 2.2), the third-party MECC (610) includes a third-party interposer (652A), in which the third-party interposer (652A) is affixed to a pairing end of the third-party MECC (610). The pairing end of the third-party MECC (610) refers to a portion of the third-party MECC (610) that can be paired in parallel with another component (e.g., the ICA (657)).

In one or more embodiments, the third-party MECC (610) may have the different structural characteristics because of the third-party interposer (652A). For example, in comparison to the interposer (e.g., 264A, FIG. 2.2), the third-party interposer (652A) may have a different mechanical connection component, a different airflow path, a different electrical connection component, etc. Details of the interposer are described above in reference to FIG. 2.2.

In one or more embodiments, to adapt the different structural characteristics of the third-party MECC (610), the ICA (657) includes a connection interface and a third-party interposer (652B). The connection interface is affixed to a first pairing end of the ICA (657) and the third-party interposer (652B) is affixed to a second pairing end of the ICA (657). The first pairing end of the ICA (657) refers to a portion of the ICA (657) that can be paired with a standard component (e.g., the MITC (620)). The second pairing end of the ICA (657) refers to a portion of the ICA (657) that can be paired with a third-party component (e.g., the third-party MECC (610)).

In one or more embodiments, the connection interface of the ICA (657) includes MECCOMs (656A). The connection interface of the MITC (620) also includes the built-in airflow connection components. To adapt the different structural characteristics of the third-party MECC (610), the third-party interposer (652B) includes matching EMACCOMs with corresponding EMACCOMs of the third-party MECC (610).

In one or more embodiments, an area enclosed by the connection interface of the ICA (657) is equal to an area enclosed by the connection interface of the MITC (620). In this manner, an end-to-end pairing between the ICA (657) and the MITC (620) may be installed for compatible mechanical, electrical, and airflow connections. Further, an area of the third-party interposer (652B) is equal to an area of the third-party interposer (652A). In this manner, an end-to-end pairing between the ICA (657) and the third-party MECC (610) may be installed for compatible mechanical, electrical, and airflow connections. However, the area enclosed by the connection interface of the ICA (657) is different from the area of the third-party interposer (652B).

The problems discussed throughout this application should be understood as being examples of problems solved by embodiments described herein, and the various embodiments should not be limited to solving the same/similar problems. The disclosed embodiments are broadly applicable to address a range of problems beyond those discussed herein.

While embodiments discussed herein have been described with respect to a limited number of embodiments, those skilled in the art, having the benefit of this Detailed Description, will appreciate that other embodiments can be devised which do not depart from the scope of embodiments as disclosed herein. Accordingly, the scope of embodiments described herein should be limited only by the attached claims.

What is claimed is:

1. A modular data center, comprising:
a modular information technology component (MITC),
wherein the MITC comprises a plurality of information handling systems (IHSs), a utility control component (UCC), and a first connection interface,
wherein the first connection interface comprises a first set of mechanical and electrical connection components (MECCOMs), a first sealing adhesive component, a first gasket, and a first set of mechanical hard-stop components; and
a modular environmental control component (MECC),
wherein the MECC comprises a plurality of environmental control components (ECCs) and a second connection interface,
wherein the second connection interface comprises a second set of MECCOMs to be paired with the first set of MECCOMs to generate at least a portion of the modular data center,
wherein the second connection interface further comprises a second sealing adhesive component, a second gasket, and a second set of mechanical hard-stop components,
wherein the first connection interface is connected to the second connection interface, wherein an area enclosed by the first connection interface is equal to an area enclosed by the second connection interface,
wherein, when the first connection interface is connected to the second connection interface, the first sealing adhesive component and the second sealing adhesive component provide a weather-proofed protection to at least the portion of the modular data center, and
wherein, when the first connection interface is connected to the second connection interface, the first set of mechanical hard-stop components and the second set of mechanical hard-stop components permit uniform compression of the first gasket and the second gasket.

2. The modular data center of claim 1, wherein the MECC comprises built-in airflow connection components that are connected to the first connection interface, wherein the built-in airflow connection components remove and supply air to the MITC.

3. The modular data center of claim 1,
wherein, when the first connection interface is connected to the second connection interface, the first set of MECCOMs transmits or receives power and data to or from the second set of MECCOMs.

4. The modular data center of claim 1, wherein the uniform compression of the first gasket and the second gasket closes any gaps that exist between a scaffold of the MITC and a scaffold of the MECC to provide a steady environment for an internal environment of at least the portion of the modular data center.

5. The modular data center of claim 4, wherein an electromagnetic interface (EMI) shielding component is attached to the scaffold of the MITC and attached to the scaffold of the MECC, wherein the EMI shielding component protects at least the portion of the modular data center from external EM radiation, wherein the EMI shielding component overlaps at least a portion of a scaffold interface.

6. A modular data center, comprising:
a first modular information technology component (MITC), wherein the first MITC comprises a plurality of information handling systems (IHSs), a first connection interface, and a first interposer,
wherein the first connection interface comprises a first set of mechanical and electrical connection components (MECCOMs),
wherein the first interposer comprises a first set of electrical, mechanical, and airflow connection components (EMACCOMs),
a modular environmental control component (MECC), wherein the MECC comprises a plurality of environmental control components (ECCs) and a second interposer,
wherein the second interposer comprises a second set of EMACCOMs to be paired with the first set of EMACCOMs to generate at least a first portion of the modular data center,
wherein the first interposer is connected perpendicularly to the second interposer, wherein an area of the first interposer is equal to an area of the second interposer; and
a modular utility control component (MUCC), wherein the MUCC comprises a second connection interface,
wherein the second connection interface comprises a second set of MECCOMs to be paired with the first set of MECCOMs to generate at least a second portion of the modular data center,
wherein the first connection interface is connected to the second connection interface, wherein an area enclosed by the first connection interface is equal to an area enclosed by the at least one connection interface,
wherein the MITC and the MUCC are oriented in a first direction, and the MECC is oriented in a second direction, wherein the first direction and the second direction are perpendicular to each other.

7. The modular data center of claim 6,
wherein, when the first connection interface is connected to the second connection interface, the first set of MECCOMs transmits or receives power and data to or from the second set of MECCOMs.

8. The modular data center of claim 6, further comprises a second MITC,
wherein the second MITC comprises a third connection interface, wherein the third connection interface comprises a third set of MECCOMs,
wherein the MUCC comprises a fourth connection interface, wherein the fourth connection interface comprises a fourth set of MECCOMs to be paired with the third set of MECCOMs to generate at least a third portion of the modular data center,
wherein the third connection interface is connected to the fourth connection interface, and
wherein an area enclosed by the third connection interface is equal to an area enclosed by the fourth connection interface.

9. The modular data center of claim 8,
wherein, when the third connection interface is connected to the fourth connection interface, the third set of MECCOMs transmits or receives power and data to or from the fourth set of MECCOMs.

10. The modular data center of claim 6,
wherein the first connection interface further comprises a first sealing adhesive component, a first gasket, and a first set of mechanical hard-stop components,
wherein the second connection interface further comprises a second sealing adhesive component, a second gasket, and a second set of mechanical hard-stop components,
wherein, when the first connection interface is connected to the second connection interface, the first sealing adhesive component and the second sealing adhesive component provide a weather-proofed protection to at least the second portion of the modular data center, and
wherein, when the first connection interface is connected to the second connection interface, the first set of mechanical hard-stop components and the second set of mechanical hard-stop components permit uniform compression of the first gasket and the second gasket.

11. The modular data center of claim 10, wherein the uniform compression of the first gasket and the second gasket closes any gaps that exist between a scaffold of the MITC and a scaffold of the MUCC to provide a steady environment for an internal environment of at least the second portion of the modular data center.

12. The modular data center of claim 11, wherein an electromagnetic interface (EMI) shielding component is attached to the scaffold of the MITC and attached to the scaffold of the MUCC, wherein the EMI shielding component protects at least the second portion of the modular data center from external EM radiation, wherein the EMI shielding component overlaps at least a portion of a scaffold interface.

13. The modular data center of claim 6,
wherein the first interposer further comprises a first sealing adhesive component, a first gasket, and a first set of mechanical hard-stop components,
wherein the second interposer further comprises a second sealing adhesive component, a second gasket, and a second set of mechanical hard-stop components,
wherein, when the first interposer is connected perpendicularly to the second interposer, the first sealing adhesive component and the second sealing adhesive component provide a weather-proofed protection to at least the first portion of the modular data center, and
wherein, when the first interposer is connected perpendicularly to the second interposer, the first set of mechanical hard-stop components and the second set of mechanical hard-stop components permit uniform compression of the first gasket and the second gasket.

14. The modular data center of claim 13, wherein the uniform compression of the first gasket and the second gasket closes any gaps that exist between a scaffold of the MITC and a scaffold of the MECC to provide a steady environment for an internal environment of at least the first portion of the modular data center.

15. A modular data center, comprising:
an interface conversion adapter (ICA), wherein the ICA comprises a first connection interface and a first third-party interposer,
wherein the first third-party interposer comprises a first set of electrical, mechanical, and airflow connection components (EMACCOMs),
wherein the first connection interface comprises a first set of mechanical and electrical connection components (MECCOMs),
a modular information technology component (MITC), wherein the MITC comprises a plurality of information handling systems (IHSs), a utility control component (UCC), and a second connection interface, wherein the second connection interface comprises a second set of MECCOMs to be paired with the first set of MECCOMs to generate at least a first portion of the modular data center, and wherein the first connection interface is connected to the second connection interface, wherein an area enclosed by the first connection interface is equal to an area enclosed by the second connection interface; and a third-party modular environmental control component (MECC), wherein the third-party MECC comprises a plurality of third-party environmental control components (ECCs) and a second third-party interposer, wherein the second third-party interposer comprises a second set of EMACCOMs to be paired with the first set of EMACCOMs to generate at least a second portion the modular data center, and wherein the second third-party interposer is connected to the first third-party interposer, wherein an area of the second third-party interposer is equal to an area of the first third-party interposer.

16. The modular data center of claim 15, wherein the first connection interface further comprises a first sealing adhesive component, a first gasket, and a first set of mechanical hard-stop components, wherein the second connection interface further comprises a second sealing adhesive component, a second gasket, and a second set of mechanical hard-stop components, wherein, when the first connection interface is connected to the second connection interface, the first sealing adhesive component and the second sealing adhesive component provide a weather-proofed protection to at least the first portion of the modular data center, and wherein, when the first connection interface is connected to the second connection interface, the first set of mechanical hard-stop components and the second set of mechanical hard-stop components permit uniform compression of the first gasket and the second gasket.

17. The modular data center of claim 15, wherein the area enclosed by the first connection interface is different than the area of the first third-party interposer.

* * * * *